United States Patent
Wanlass et al.

(10) Patent No.: US 7,095,050 B2
(45) Date of Patent: Aug. 22, 2006

(54) VOLTAGE-MATCHED, MONOLITHIC, MULTI-BAND-GAP DEVICES

(75) Inventors: Mark W. Wanlass, Golden, CO (US); Angelo Mascarenhas, Lakewood, CO (US)

(73) Assignee: Midwest Research Institute, Kansas City, MO (US)

( * ) Notice: Subject to any disclaimer, the term of this patent is extended or adjusted under 35 U.S.C. 154(b) by 0 days.

(21) Appl. No.: 10/275,123

(22) PCT Filed: Feb. 28, 2002

(86) PCT No.: PCT/US02/05871

§ 371 (c)(1),
(2), (4) Date: Mar. 10, 2003

(87) PCT Pub. No.: WO03/073518

PCT Pub. Date: Sep. 4, 2003

(65) Prior Publication Data

US 2003/0160251 A1 Aug. 28, 2003

(51) Int. Cl.
*H01L 33/00* (2006.01)

(52) U.S. Cl. .............................. 257/79; 257/81; 257/86; 257/104

(58) Field of Classification Search .................. 257/79, 257/81, 86, 104
See application file for complete search history.

*Primary Examiner*—Fetsum Abraham
(74) *Attorney, Agent, or Firm*—Paul J. White

(57) ABSTRACT

Monolithic, tandem, photonic cells include at least a first semiconductor layer and a second semiconductor layer, wherein each semiconductor layer includes an n-type region, a p-type region, and a given band-gap energy. Formed within each semiconductor layer is a sting of electrically connected photonic sub-cells. By carefully selecting the numbers of photonic sub-cells in the first and second layer photonic sub-cell string(s), and by carefully selecting the manner in which the sub-cells in a first and second layer photonic sub-cell string(s) are electrically connected, each of the first and second layer sub-cell strings may be made to achieve one or more substantially identical electrical characteristics.

54 Claims, 11 Drawing Sheets

VOLTAGE-MATCHED, MONOLITHIC, MULTI-BAND-GAP DEVICES

GOVERNMENT INTERESTS

The United States Government has rights in this invention under Contract No. DE-AC36-99GO10337 between the United States Department of Energy and the National Renewable Energy Laboratory, a Division of the Midwest Research Institute.

FIELD OF THE INVENTION

In general, various embodiments of the present invention described herein relate to monolithic, tandem, photonic devices. More particularly, various embodiments of the present invention relate to monolithic, tandem, photonic devices, such as photovoltaic cells and/or light emitting diodes, that are formed of, or include, multiple strings of electrically interconnected sub-cells.

BACKGROUND OF THE INVENTION

In general, semiconductor-based photonic devices, such as photovoltaic cells (PV cells) and light emitting diodes (LEDs), include a junction formed between p-type and an n-type conductivity regions in a semiconductor body. In the case of PV cells, these regions generate a voltage potential and/or a current across the junction when electron-hole pairs are created in the semiconductor body in response to impinging photons on the photovoltaic cell. When a load is connected between the p-type and an n-type conductivity regions, an electric current will flow, thus producing power. In the case of LEDs, these p-type and an n-type conductivity regions generate or emit photons when sufficient voltage is applied across the junction to cause a recombination of electrons and holes.

PV cells come in two basic forms, solar photovoltaic (SPV) cells and thermovoltaic (TPV) cells. The principle operational difference between SPV cells and TPV cells relates to the energy level that photons impinging on the PV cell must have in order to generate a voltage potential and/or current. For example, SPV cells typically produce electrical energy when exposed to photons having relatively high energy levels (roughly corresponding to or occurring in the visible spectrum light). In contrast, TPV cells typically produce electrical energy when exposed to photons having relatively low energy levels (roughly corresponding to or occurring in the infrared spectrum of light).

In order to provide useful power, individual PV cells, are typically electrically and physically connected or grouped together to provide appropriate current and voltage levels. When a number of individual PV cells are electrically and physically grouped together into a single PV device the resulting PV device is often referred to as a PV cell, while the individual PV cells that make up the device are referred to as PV sub-cells. Additionally, groups of PV cells may be connected together and packaged into a scaled unit that is commonly referred to as a PV module.

PV sub-cells are typically physically connected or positioned with respect to one another in a PV cell either in strings, stacks, or in combinations of strings and/or stacks. A PV sub-cell string typically comprises two or more PV sub-cells arranged side-by-side, in line, in a horizontal string. A PV sub-cell string may be composed of a number of individual, discrete PV sub-cells connected together to form the string. Alternatively, a PV sub-cell string may be composed of a number of PV sub-cells, each of which are formed or grown as a part of a single, monolithic, crystalline structure. When each of the PV cells in a PV sub-cell string is formed or grown as a part of a single, monolithic, crystalline structure, the PV sub-cell string is typically referred to as monolithic interconnected module (MIM).

A PV sub-cell stack typically comprises two or more PV sub-cells vertically arranged one on top of the other. The PV sub-cell stack may be composed of a number of individual, discrete PV sub-cells physically bonded together to form the stack. Alternatively, the PV sub-cell stack may be composed of a number of PV sub-cells, each of which is formed together in a tandem, multi-band-gap, monolithic stack.

In addition to the various ways in which PV sub-cells are physically connected or positioned with respect to one another in a PV cell, there are also a number of ways in which PV sub-cells may be electrically connected to one another in a PV cell. PV sub-cells are typically electrically connected to one another in a PV cell either in a series type electrical connection, a parallel type electrical connection, or some combination of series and parallel type electrical connections. In a series type electrical connection, each n-type or p-type conductivity region in a PV sub-cell is connected either to an opposite n-type or p-type conductivity region in another PV sub-cell or to an output terminal or bus bar. Alternatively, in a parallel type electrical connection, each like conductivity regions in a PV sub-cell is connected to the same like conductivity region in another PV sub-cell or to an output terminal or bus bar.

The particular connection used in a PV cell to electrically connect the various PV sub-cells determines or dictates the electrical characteristics of the PV cell. For example, when each of the PV sub-cells in a PV cell are electrically connected in series, the overall voltage of the PV cell will be equal to the sum of the voltages of the PV sub-cells in the PV cell, while the overall current of the PV cell will be limited to the current value of the PV sub-cell that produces the lowest current. In contrast, when each PV sub-cells in a PV cell are electrically connected in parallel, the overall current of the in a PV cell will be equal to the sum of the individual currents of the PV sub-cells in the PV cell, while the overall voltage of the PV cell will be limited to some intermediate voltage value that is between the highest voltage value achieved by any one of the parallel connected PV sub-cells and the lowest voltage achieved by any one of the parallel connected PV sub-cells. In the case where each of the parallel connected PV sub-cells achieve a common voltage, the overall voltage achieved by the PV cell will be equal to that common voltage.

Because of the typically small voltages by each PV sub-cell in a PV sub-cell string, PV sub-cell strings are more commonly connected in series to achieve a PV cell string having a relatively high operating voltage. These high voltage PV cells offer a number of significant to advantages over low voltage PV cells, such as reduced power losses and increased overall operating voltages.

Another factor that is typically considered in designing and manufacturing PV cells is the photon absorbing capabilities of the PV-sub-cells in a PV cell. As is known, a particular PV sub-cell will absorb, and convert to electrical energy, photons with energy levels greater than a band-gap energy of the particular semiconductor material used to fabricate the PV sub-cell. When a given PV sub-cell is exposed to a radiant energy source that produces photons having a wide range of energy levels, such as the sun, only those photons having energy levels greater than or equal a band-gap energy of the given PV sub-cell will make a contribution to the electrical energy output from the cell. Conversely, those photons from the radiant energy source having energy levels less than the band-gap energy of the given PV sub-cell will make no contribution to the electrical energy output from the given PV sub-cell. As such, the energy contained in the photons having energy levels less than the band-gap energy of the given PV sub-cell is wasted.

One way in which this wasted energy can be recovered is to combine a number of PV sub-cells, each having a different band-gap energy, together in a stack of PV sub-cells. By designing the PV sub-cell stack to include PV sub-cells having different band-gap energies, photons having an energy level that is not absorbed and converted to electrical energy by one PV sub-cell in the stack may be absorbed and converted to electrical energy by another PV sub-cell in the stack.

These stacks of PV sub-cells may be composed of individual discrete PV sub-cells that are mechanically bonded together into a single stack. Unfortunately, mechanically bonding PV sub-cells together in this manner has a number of drawbacks, such as added complexity of manufacturing and concurrent increased cost to manufacture each stack of PV sub-cells. A number of MIM cells, each having a different band-gap, may also be bonded together in a single stack. Again, these mechanically bonded MIM cells share the same problems as those discussed with respect to mechanically bonded PV sub-cells.

In an alternative to physically bonding a number of PV sup-cells, a similar, but more desirable result may be achieved by producing a single monolithic tandem PV cell having multiple p-n junctions and multiple band-gaps, layered on top of the other. Layered in this manner, each set of p-n junctions may be considered to define a single, separate PV sub-cell in a vertical stack of PV sub-cells, called a PV sub-cell stack. Once arranged or fabricated in this manner, each of the individual PV sub-cells in the PV sub-cell stack are then electrically interconnected to one another in a single vertical string of serially connected PV sub-cells, where the serial connection between the PV sub-cells in the PV sub-cell stack is achieved using tunnel junctions formed between vertically adjacent PV sub-cells in the PV sub-cell stack. Unfortunately, serially interconnecting the PV sub-cells in the PV sub-cell stack in this manner limits the overall output voltage of the PV sub-cell stack to the sum of the output voltages of the PV sub-cells in the stack. As PV sub-cell stacks of this type have typically only included two PV sub-cells, the overall output voltage achieved by the PV sub-cell stack has been limited to the sum of the output voltages achieved by two PV sub-cells.

While PV sub-cell stacks of this type have proven to be highly effective, reaching efficiencies upwards of 30%, there are still a number of drawbacks and limitations associated with their manufacture and operation. For example, in order to achieve appropriate output voltages using PV sub-cell stacks, such as those just describe, it has been necessary to form physical and electrical connections between a number of these PV sub-cell stacks. Unfortunately, forming these physical and electrical connections between numbers of discrete PV sub-cell stacks adds manufacturing complexity and, thus increased manufacturing cost to the production of PV cells employing these PV sub-cell stacks. Additionally, since each of the PV sub-cells in a given PV sub-cell stack are in essence "hard-wired" in series to the other PV sub-cells in the PV sub-cell stack, the electrically interconnections that may be achieved by any PV cells employing these "hard-wired" PV-sub-cell stacks is greatly limited.

LED devices are typically constructed as either individual, discrete LED cells having a single p-n or n-p junction, or as a number of individual, discrete LED cells that are mechanically and electrically connected. The frequency of the photons (color of the light) that will be emitted by an LED is determined or dictated by the particular band-gap energy of the semiconductor material that forms the LED. For example, an LED cell that is formed of a semiconductor material having a band-gap energy of between 1.8–2.2 eV will produce a red-yellow light, an LED cell that is formed of a semiconductor material having a bang-gap energy of between 2.2–2.4 will produce a red-yellow light, and all LED cell that is formed of a semiconductor material having a bang-gap energy of between 2.4–2.6 eV will produce a blue light.

To produce an LED device that will emit light of a selected color, the device may be formed of one or more discrete LED cells, each LED being formed of a semiconductor material having an appropriate band-gap energy to produce the given color. Alternative, a number of sets of discrete LED cells, each emitting light of different color, may be situated in close proximity to one another, side-by-side, in the LED device, such that the colors produced by each of the individual LED cells will combine to produce the selected color. For example, a set of LED cells may include a red light producing LED, a blue light producing LED, and a green light producing LED. By increasing or decreasing the current supplied by each separate LED cell, and thus increasing the intensity of light produced by the LED cell, an appropriate blend of colors may be achieved by the LED device to produce a variety of perceived colors. One drawback associated with these LED devices employing three different color producing cells arranged "side-by-side," is that the surface areas of these type of cells necessarily consume more surface area than a typical single color producing LED cell. As such, it is difficult to produce these types of cells in high densities. Another drawback associated with these types of cells in the complexity in electrical interconnects and the control circuitry that is used to control these devices. For example, it is typically necessary to have a separate pair of biasing terminals for each of the three different color producing cells.

It is against this backdrop the present invention has been developed.

SUMMARY OF THE INVENTION

In general, the present invention relates to photonic devices. More particularly, the present invention relates to monolithic, tandem, photonic devices that are formed of, or include, multiple strings of electrically interconnected sub-cells. By carefully selecting the number of sub-cells in a sub-cell strings, and/or the manner in which the sub-cells in a sub-cell strings are electrically connected, a variety of operational characteristics may be achieved in each of the sub-cell strings, and thus in a monolithic, tandem, photonic device constructed in accordance with the present invention.

In one embodiment of the present invention, a monolithic, tandem photonic cell includes at least a first semiconductor layer and a second semiconductor layer, wherein each semiconductor layer includes an n-type region, a p-type region, and a given band-gap energy. Formed within the semiconductor layers of the photonic cell are a number trenches that sub-divide the photonic cell into a number of photonic sub-cell stacks, wherein each photonic sub-cell stack includes a photonic sub-cell corresponding to the first layer (a first layer photonic sub-cell) and a photonic sub-cell corresponding to the second layer (a second layer photonic sub-cell). In this embodiment, electrical connections are formed between various ones of the first layer photonic sub-cells to form one or more first layer photonic sub-cell strings. Similarly, electrical connections are formed between various ones of the second layer photonic sub-cells to form one or more second layer photonic sub-cell strings. By carefully selecting the numbers of photonic sub-cells in the first and second layer photonic sub-cell string(s), and by carefully selecting the manner in which the sub-cells in a first and second layer photonic sub-cell string(s) are electrically connected, each of the first and second layer sub-cell strings may be made to achieve one or more substantially identical electrical characteristics. For example, where the photonic cell comprises a photovoltaic cell, the output voltages of the sub-cell strings may be made to produce a common output voltage under illumination. Where the photonic cell comprises a light emitting diode cell, the sub-cell strings may be arranged and connected such that an appropriate bias voltage is achieved for each of the sub-cells in a string. Each of the first and second layer photonic sub-cell strings may be either electrically connected in series to produce a single, two-terminal, monolithic, tandem photonic cell or each of the sub-cell strings may be accessed separately.

DETAILED DESCRIPTION OF THE INVENTION

Figure 1:
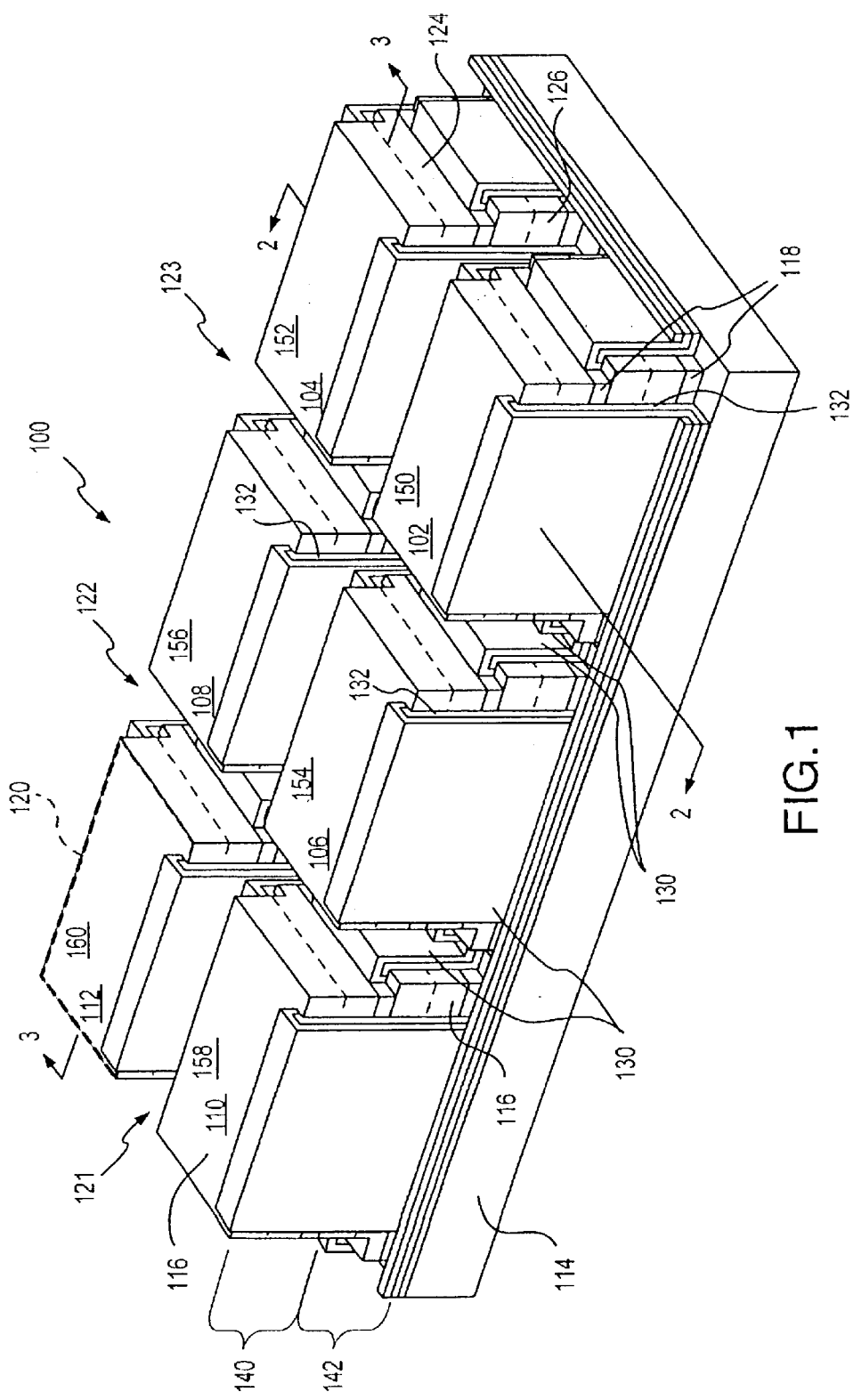
FIG. 1 illustrates a photovoltaic (PV) cell constricted in accordance with a first embodiment of the present invention.

In general, various embodiments of the present invention relate to multi-cell photonic devices, such as multi-sub-cell photovoltaic (PV) devices and multi-cell Light Emitting Diodes (LED) devices. More particularly, various embodiments of the present invention relate to electrically interconnecting strings of sub-cells in a tandem, monolithic photonic devices, in a manner such that each string of sub-cells in tandem, monolithic photonic device achieves one or more similar or identical operational characteristics.

As described, some embodiments of the present invention relate particularly to PV cells. As is known, PV cells may comprise one or more electrically connected PV sub-cells. As is also known, each of the individual PV sub-cells in a PV cell is typically formed of a semi-conducting material having an n-type region, a p-type region, and an n-p or p-n junction between n-type region and p-type region. The particular semi-conducting material(s) used in a PV sub-cell may vary depending on the desired operational and design characteristics of the PV sub-cell. For example, the particular type of semi-conducting material used in a PV sub-cell will dictate the band-gap energy of the PV sub-cell.

In operation, when photons of sufficient energy strike a PV sub-cell, photons are absorbed by the PV sub-cell and pairs of electrons and electron holes are produced as a result. As is known, a particular PV sub-cell will only absorb photons having an energy greater than or equal to the band-gap energy of that particular PV sub-cell. When pairs of electrons and electron holes are produced in the PV sub-cell, the electrons move to the n-type region, while the electron holes move to the p-type region, causing an electromotive force (voltage) to be generated across the junction between the n-type and the p-type regions. Typically, the n-type region is referred to as the emitter of the PV sub-cell, while the p-type region is referred to as the base of the PV sub-cell. By connecting a load between the emitter and the base positions of the PV sub-cell, an electrical current may be generated.

As previously described, various embodiments of the present invention relate to electrically interconnecting strings of PV sub-cells in a tandem, monolithic PV cell, in a manner such that each PV sub-cell string achieves one or more similar or identical operational characteristics. For example, it is desired that each PV sub-cell string achieves a similar or identical output voltage under illumination. In one embodiment, this is achieved by first dividing a tandem, monolithic PV cell into a number of individual PV sub-cell stacks, where each PV sub-cell stack includes at least two PV sub-cells. Once the tandem, monolithic PV cell has been divided, strings of PV sub-cells are defined, wherein each string of PV sub-cells includes at least two individual PV sub-cells. The individual PV sub-cells in each given string of PV sub-cells are then electrically interconnected to produce a PV sub-cell string having a single positive electrical terminal and a single negative electrical terminal.

As will be described, in this embodiment, the individual PV sub-cells in each PV sub-cell string are then preferably electrically interconnected in a manner such that the overall output voltage of each given string of PV sub-cells in the tandem, monolithic PV cell, as measured between the positive and negative terminals of the given string of PV sub-cells, is substantially similar to the output voltage of every other PV sub-cell string in the tandem, monolithic PV cell. That is, all of the PV sub-cell strings in the tandem, monolithic PV cell are preferably voltage-matched. Once each of the PV sub-cell strings in the PV cell have been voltage-matched, the PV sub-cell strings may be electrically connected, negative terminal to negative terminal and positive terminal to positive terminal, to create a two-terminal, tandem monolithic PV cell.

Turning now to FIG. 1, illustrated therein is one simplified embodiment of a two-terminal, tandem, monolithic PV cell 100 in accordance with a first embodiment of the present invention. It should be understood that the PV cell illustrated in FIG. 1 has been simplified so that a basic understanding of some of the main concepts involved with, or incorporated in, various embodiments of the present invention may more easily be understood. Furthermore, the dimensions and proportions of the PV cell 100 illustrated in FIG. 1 have been exaggerated for clarity, as will be readily understood by persons skilled in the art. As will be described below in greater detail, the various concepts, features, and techniques that will now be described with respect to the PV cell 100 shown in FIG. 1, may be extended to PV cells having greater numbers of PV sub-cells, greater numbers of PV sub-cell strings, greater numbers of PV sub-cells in a PV sub-cell strings, and/or greater numbers of PV sub-cells in a PV-sub-cell stack. Furthermore, as will be described below, the various concepts, features, and techniques that will now be described with respect to the PV cell 100 may be extended to PV cells having various other outer circumferential shapes.

As illustrated in FIG. 1, the PV cell 100 includes a number of PV sub-cell stacks 102, 104, 106, 108, 110, and 112 situated on a substrate 114. In this embodiment, each of the PV sub-cell stacks includes a number of PV sub-cells 116. Each of the PV sub-cells includes a n-type conductivity region, a p-type conductivity region, and a junction (either n-p or p-n) between the n-type and p-type conductivity regions. As is well known in the art, possible semiconductor materials for use in the present invention include, without limitation, materials having band-gap energies 0.2 eV to 2.5 eV.

In addition to the n-type and p-type conductivity regions, each PV sub-cell 116 may include an isolation region 118 that provides some level of electrical isolation between the PV sub-cell that includes the isolation region 118 and another PV sub-cell, or between the PV sub-cell that includes the isolation region 118 and the substrate 114. The isolation region 118 will preferably be at least partially transparent to photons, so that photons passing through one PV sub-cell in a PV sub-cell stack will be allowed to pass through the isolation region 118 to a lower PV sub-cell 116 in a PV sub-cell stack, if another, lower PV sub-cell 116 is positioned beneath the one PV sub-cell. Typical isolation regions include, without limitation, high resistivity diodes and/or isolation diodes. As will be understood, each PV sub-cell 116 may also include other regions, materials, or layers not shown in FIG. 1. A device, such as PV cell 100, having more than one p-n or n-p junction, is herein referred to as tandem device.

In this first embodiment, the PV sub-cells 116, the PV-sub-cell stacks 102, 104, 106, 108, 110, and 112, and the substrate 114 together comprise a single, crystalline, tandem device, referred to as a monolithic, tandem device or cell. Alternatively, the PV-sub-cell stacks 102, 104, 106, 108, 110, and 112 may be may be monolithically grown on other on other types of substrates, such as, without limitations glass, steel, molybdenum, sapphire, or any other substance that is suitable for deposition. The monolithic tandem device may be formed in any manner known in the art. For example, and without limitations the monolithic device may be formed as a number of layers of crystalline material that have been epitaxially deposited (i.e., grown), one on top of the other. Persons skilled in the art will understand that the growth of each layer of crystalline material attempts to mimic the crystalline structure (i.e., lattice constant) of the initial layer or substrate, although many materials are different enough to cause stresses and mismatches at interfaces of such materials.

The materials for each layer of the PV sub-cells 100 may be carefully selected such that the lattice constants of each layer are substantially equal (i.e., lattice-matched materials). In this context, lattice-matched materials means two materials with lattice constants that are similar enough that when the two materials are grown adjacent to each other in a single crystal the difference or mismatch between lattice constants is resolved by elastic deformation, not by inelastic relaxation, which often results in the formation of dislocations or other undesirable defects.

In this first embodiment, each of the sub-cells in a sub-cell stack will preferably have the same outer circumferential shape. For example, as shown in FIG. 1, each of the PV sub-cells 116 have a rectangular outer circumferential shape, as indicated by the dotted line 120. In this way, the absorption area of each overlying and underlying PV sub-cell 116 in a PV sub-cell stack will be identical. As will be explained in greater detail below, the selection of a particular outer circumferential shape 120 of the PV sub-cell 116, and thus the PV sub-cell stacks, in a particular PV cell may vary depending on the number of PV sub-cells in each PV sub-cell stack, the operational characteristics desired of a particular PV cell, and the outer circumferential shape of the PV sub-cell 116 itself.

Once selected, the outer circumferential shape 120 of the PV sub-cells may be achieved in a number of ways. For example, and without limitation, the outer circumferential shapes 120 of each of the PV sub-cells in the PV cell 100 may be achieved by forming a number of isolation trenches 121, 122, and 123 between the various PV sub-cell stacks in the PV cell. These trenches may be formed in any number of ways known in the art. For example, the trenches may be formed by a chemical technique, e.g., etching, or mechanical technique, e.g., laser ablation, or any other technique known to form trenches in a semiconductor material. Preferably, the trenches 121, 122, and 123 are formed in such a manner and depth that electrical isolation is achieved between each of the sub-cell stacks 102, 104, 106, 108, 110, and 112 in the PV cell 100.

As shown in FIG. 1, various PV sub-cells 116 in the various PV sub-cell stacks 102 for example are electrically interconnected by a number of interconnect layers 130. In this first embodiment these interconnect layers 130 are formed predominantly within the trenches 121, 122, and 123. The various ways in which the PV sub-cells in the PV sub-cell stacks 102, 104, 106, 108, 110, aid 112 may be electrically interconnected by the interconnect layers 130 is described in detail below. Interconnect layers may be formed from any material capable of conducting electricity, for example, without limitation, a metal or transparent conducting oxide.

As also shown in FIG. 1, the interconnect layers 130 may be electrically isolated from one another, from the PV sub-cells, and/or from the substrate 114 by insulation layers 132. Insulation layers for use in the present invention include, without limitation, electrical insulating materials, such as silicon dioxide or silicon nitride or any other resistive oxide.

As described, each of the PV sub-cell stacks 102, 104, 106, 108, 110, and 112 in the PV cell 100 includes a number of PV sub-cells 116. In a preferred embodiment, the materials that form each of the PV sub-cells 116 in a PV sub-cell stack will be selected to absorb photons having different energy levels. Stated another way, each PV sub-cell in a PV sub-cell stack will preferably have a different band-gap energy. Additionally, in one embodiment, the PV sub-cells will preferably be arranged in the PV sub-cell stacks according to the band-gap energies of the PV sub-cells, with the PV sub-cell having the highest band-gap energy being located at the top of the stack, the PV sub-cell having the next highest band-gap energy being located below the PV sub-cell having the highest band-gap, and so on in descending order of band-gap energies, to the bottom of the PV sub-cell stack. In one embodiment, such as the PV cell 100 shown in FIG. 1 the PV sub-cell 124 located at the top of the PV sub-cell stack is the PV sub-cell positioned farthest from the substrate 114. In other embodiments, described below, the PV sub-cell located at the top of the PV sub-cell stack is the PV sub-cell positioned closest to the substrate 114.

In operation, as photons of different energy levels impinge on the PV cell 100, photons having all energy greater than or equal to the band-gap of the PV sub-cell positioned at the top of the PV sub-cell stack 124 (the top PV sub-cell) will typically be absorbed and converted to electricity by the top PV sub-cell 124. Photons with energy less than the band-gap energy of the top PV sub-cell 124 will typically pass through the top PV sub-cell to the next PV, or second PV sub-cell 126. In a similar manner, photons which have passed through the top PV sub-cell 124, and which have an energy greater than or equal to the band-gap energy of the second PV sub-cell 126, positioned below the top PV sub-cell, will be absorbed and converted to electricity by the second PV sub-cell 126. In the case where additional PV sub-cells, each having a progressively lower band-gap energy, are positioned below the second PV sub-cell 126, this process will continue on, with each given additional PV sub-cell in the stack absorbing and converted to electricity those photons having a energy greater than or equal to the band-gap energy of the given sub-cell.

As described, each of the top PV sub-cells 124 in each of the PV sub-cell stacks 102, 104, 106, 108, and 112 are of a similar material composition and have a similar band-gap energy. As such, each of the top PV sub-cells 124 in each of the PV sub-cell stacks may be said to be in a common PV sub-cell layer, the top PV sub-cell layer 140. Likewise, each of the second PV sub-cell 126 of the PV sub-cell stacks are of a similar material composition and have a similar band-gap energy. As such, each of the second PV sub-cells 124 in each of the PV sub-cell stacks may be said to be in a common PV sub-cell layer, the second PV sub-cell layer 142, and so on.

As previously described, in various embodiments of the present invention, numbers of individual PV sub-cells 116 in the PV cell 100 are electrically connected to form PV sub-cell strings. In a preferred embodiment, the PV sub-cell strings are formed by electrically connecting PV sub-cells having the same band-gap energy. As such, in this embodiment, the PV sub-cell strings in a given PV cell 100 may either contain PV sub-cells from the top PV sub-cell layer 140 or PV sub-cells from the second PV sub-cell layer 142. That is, in this embodiment, the PV sub-cell strings will only include PV sub-cells from a single layer of the PV cell. In other embodiments, PV sub-cell strings may contain PV sub-cells having different band-gap energies. As such, in a monolithic PV cell, these PV sub-cell strings would contain PV sub-cells from different PV sub-cell layers.

As previously noted, in various embodiments, each of the PV sub-cells in a PV sub-cell string will preferably be connected in series to form a two-terminal PV sub-cell string. When each of the PV sub-cells in a PV sub-cell string is connected in series in this manner, each PV sub-cell string will generate a voltage potential ($V_{sub\text{-}cell}$), when under illumination, that is equal to the ($V_{string}$) of the voltage potentials of each of the PV sub-cells in the PV sub-cell string. Since the voltage potential-generated by any particular PV sub-cell under illumination is directly related to the band-gap energy of the particular PV sub-cell, the overall voltage potential generated by a given PV sub-cell string will be directly related to the band-gap energies of the PV sub-cells in the given PV sub-cell string and the total number of PV sub-cells in the given PV sub-cell string.

In various embodiments, each of the PV sub-cell stings in the PV sub-cell 100 will have the same approximate voltage characteristics, or output voltage levels under a given photon illumination. In this way, each of the PV sub-cell strings in a PV cell, such as PV cell 100, may be connected together in parallel to form a two-terminal PV cell. However, as PV sub-cells in different layers may have different band-gap energies, two PV sub-cell strings, formed from PV sub-cells in two different layers of the PV cell, each layer having a different band-gap energy, will not generate equal voltage potentials under illumination if the number of the PV sub-cells in the two PV sub-cell strings is equal. This problem is magnified if the PV cell includes more than two different layers, each layer having a different band-gap energy.

To address this problem, various embodiments of the present invention relate to constructing PV cells in a manner such that each PV sub-cell string includes the appropriate number of sub-cells, such that each PV sub-cell string in the PV cell develops approximately the same voltage potential when the PV cell is under illumination.

Returning now to FIG. 1, let us assume that each of the PV sub-cells in the top PV sub-cell layer 140 generate a voltage under illumination of 1.5 volts. Furthermore, let us assume that each of the PV sub-cells in the second PV sub-cell layer 142 generate a voltage under illumination of 1.0 volts. In such a case, if two of the PV sub-cells in the top PV sub-cell layer 140, such as PV sub-cells 150 and 152, are connected in series to form a "top layer" PV sub-cell string, the top layer PV sub-cell string will generate a voltage under illumination of 3 volts. If the remaining PV sub-cells in the top PV sub-cell layer 140 are also serially connected in groups of two cells to form two additional top layer PV sub-cell strings, such as PV sub-cell 154 together with PV sub-cell 156 and PV sub-cell 158 together with PV sub-cell 160, each of these two additional top layer PV sub-cell strings will also generate a voltage under illumination of 3 volts. As such, each of these three top layer PV sub-cell strings may then be connected in parallel to form a top layer group of PV sub-cell strings that generates a voltage under illumination of 3 volts.

In a similar manner, if three of the PV sub-cells cells in the second PV sub-cell layer 142 such as PV sub-cells 340, 342, and 344 (See FIG. 3), are connected in series to form a second layer PV sub-cell string, the second layer PV sub-cell string will also generate a voltage under illumination of 3 volts. If the remaining PV sub-cells in the second PV sub-cell layer 142 are also serially connected in a group of three cells to form an additional second-layer PV sub-cell string, this additional second-layer PV sub-cell strings will also generate a voltage under illumination of 3 volts. These two second-layer PV sub-cell strings may then be connected in parallel to form a second-layer group of PV sub-cell strings that generates a voltage under illumination of 3 volts.

Finally, as both the top layer group of PV sub-cell strings and the second-layer group of PV sub-cell strings generate a voltage under illumination of 3 volts, the top layer group of PV sub-cell strings and the second-layer group of PV sub-cell strings may then be electrically connected together in parallel to form a two-terminal PV cell that generates a voltage under illumination of 3 volts. As will be understood, this same basic concept of electrically connecting various numbers of PV sub-cells in PV sub-cell strings, such that each PV sub-cell string generates the same voltage under illumination, may be extended beyond PV cells having two layers of PV sub-cells, such as PV cell 100, into PV cells having three or more layers of PV sub-cells.

Figure 2:
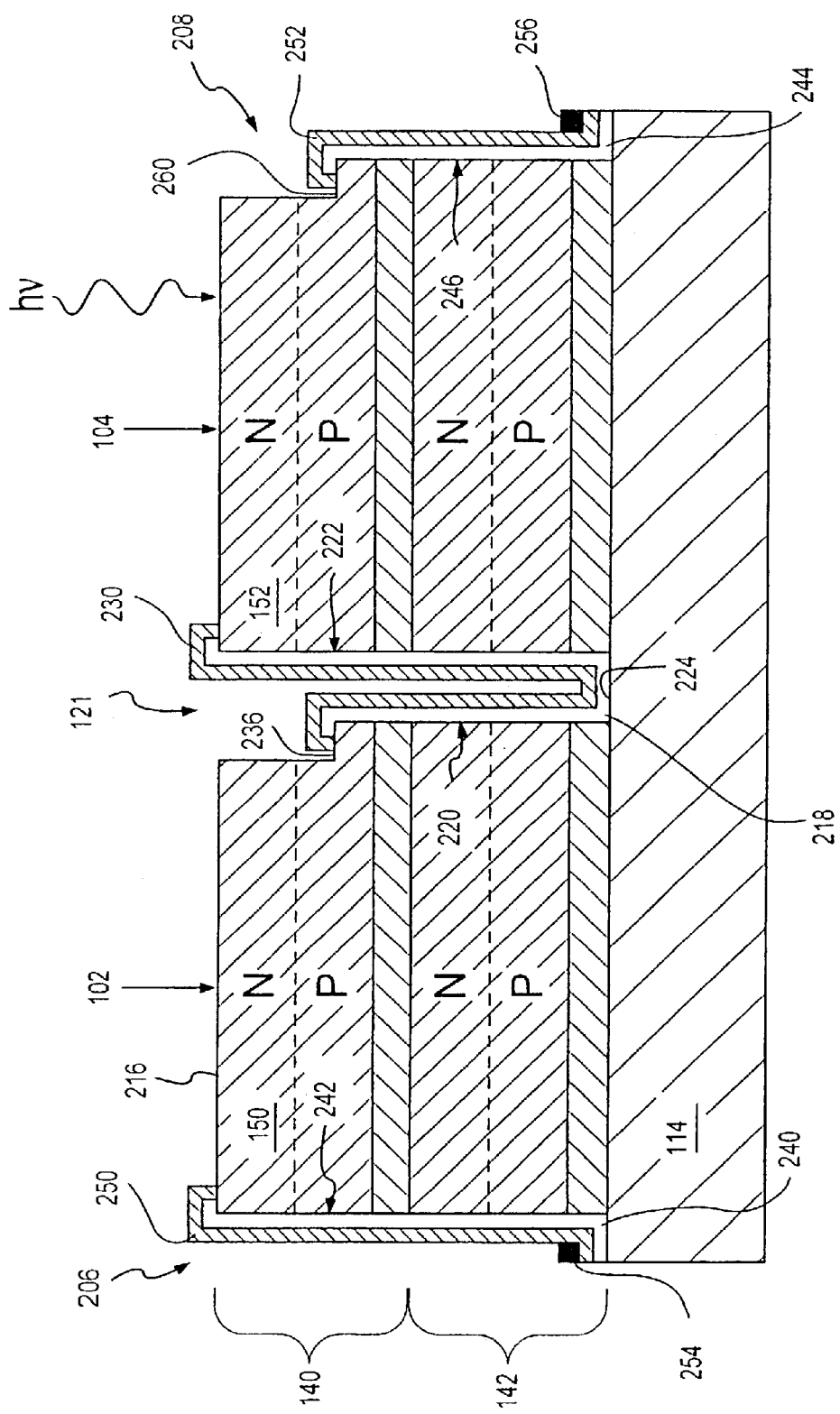
FIG. 2 illustrates a cross-sectional view of the PV cell shown in FIG. 1, taken along the line 2—2, illustrating various electrical connections formed in the PV cell in accordance with the first embodiment of the present invention.

FIG. 2 illustrates a cross-sectional view of the PV cell 100, taken along the line 2—2 shown in FIG. 1. FIG. 2 illustrates, without limitation, one example of electrical interconnections that may be formed in the trench 121 between the PV sub-cells in the top layer 140 of the PV cell 100. In particular, FIG. 2 illustrates an example of the electrical interconnections that may be formed in the trench 121 between PV sub-cells 150 and 152. It should be understood that similar electrical interconnections may be formed in the trench 121 between PV sub-cells 154 and 156 (see FIG. 1), and between PV sub-cells 158 and 160 (see FIG. 1). Furthermore, it should be understood that that similar electrical interconnections may be formed in trenches separating top-layer PV sub-cells in PV cells containing more than two layers.

As shown in FIG. 2, the trench 121 is preferably formed in such a manner that electrical isolation is provided between the PV sub-cell stacks 102, 106, and 110 on one side of the trench 121, and the PV sub-cell stacks 104, 108, and 112 on the other side of the trench 121. For example, as shown in FIG. 2, the trench 121 is formed in such a manner that electrical isolation is provided between the PV sub-cell stacks 102 and 104. The trench 121 may extend downward from a top surface 216 of the PV cell 100 to the substrate 114, such as shown in FIGS. 1 and 2 or, in an alternative embodiment, the trench 121 may extend downward from a top surface 216 of the PV cell 100 into the substrate 114, to assure that electrical isolation is achieved between the PV sub-cell stacks (not shown).

Once the trench 121 has been formed, an insulating layer 218 may then be deposited or formed in the trench 121, along the sidewalls of the PV sub-cell stacks that are adjacent to the trench 121. For example, as shown in FIG. 2, the insulating layer 218 is deposited or formed in the trench 121 along the sidewalls 220 and 222 of stacks 102 and 104, respectively, and along an upper surface 224 of the substrate 114. The insulating layer 218 may comprise any number of materials that are used in the art for providing electrical insulation in semiconductor devices and which may be deposited in a relatively uniform manner and thickness on semiconductor-materials. For example, and without limitation the insulating layer 218 may comprise a semiconductor material having high resistivity, for example a material formed into a isolation diode.

Once the insulating layer 218 has been deposited, an electrically conductive interconnect layer 230 is then deposited in the trench 121 on top of the insulating layer 218. As shown in FIG. 2, the interconnect layer 230 is deposited in the trench 121 in such a manner that electrical connections are made between PV sub-cells 150 and 152. In one embodiment, a ledge or lip may be etched or formed into a sidewall of PV sub-cell to provide an area for electrically connecting the interconnect layer 230 to the PV sub-cell. For example, as shown in FIG. 2, a ledge 236 is etched or formed into the PV sub-cell 150 along sidewall 220, for the interconnect layer 230 to contact the p-type region of PV sub-cell 150.

As will be appreciated to those skilled in the art, in the case where a series electrical connection is desired between pairs of top layer PV sub-cells, a portion of the interconnect layer 230 will contact either the n-type region or the p-type region of a PV sub-cell on one side of the trench 121, and another portion of the interconnect layer 230 will contact the opposite conductivity type region (either n-type layer or p-type layer) of a PV sub-cell on the opposite side of the trench 121. For example, and without limitation, as shown in FIG. 2, the interconnect layer 230 contacts the p-type layer of the PV sub-cell 150 and the n-type layer of the PV sub-cell 152. Connected as such, PV sub-cell 150 and PV sub-cell 152 are said to be in a series connected, top-level PV sub-cell string.

FIG. 2 also illustrates how a single positive and a single negative terminal may be formed for top-level PV sub-cell strings. Again, the top-level PV sub-cell string including PV sub-cells 150 and 152 will be used as an example. However, it will be understood that positive and negative terminals for other top-level PV sub-cell strings may be formed in a similar manner. In one embodiment, before forming positive and negative terminals for top-level PV sub-cell strings, trenches or channels are formed along sidewalls of the PV sub-cell stacks opposite the trench 121. For example, as shown in FIG. 2 a first channel 206 is formed along sidewall 242 of the PV sub-cell stack 102 and a second channel 208 is formed along sidewall 246 of the PV sub-cell stack 102. Preferably, the channels 206 and 208 are formed at the same time, and with the same process or processes used with respect to the formation of the trench 121.

To form a negative terminal for the top-level PV sub-cell string including PV sub-cells 150 and 152, an insulating layer 240 is first deposited or formed along the sidewall 242 of the PV sub-cell stack 102. The insulating layer 240 may also be formed along the upper surface 224 of the substrate 114, as shown in FIG. 2. Once the insulating layer 240 has been deposited, an electrically conductive interconnect layer 250 is then deposited on top of the insulating layers 240. As shown in FIG. 2, a portion of the interconnect layer 250 contacts the n-type region of PV sub-cell 150. As such, the interconnect layer 250 forms a negative terminal for the PV sub-cell string.

To form a positive terminal for the top-level PV sub-cell string including PV sub-cells 150 and 152, an insulating layer 244 is first deposited or formed along the sidewall 246 of the PV sub-cell stack 104. The insulating layer 244 may also be formed along the upper surface 224 of the substrate 114, as shown in FIG. 2. Once the insulating layer 244 has been deposited, an electrically conductive interconnect layer 252 is then deposited on top of the insulating layer 244. As shown in FIG. 2, a portion of the interconnect layer 250 contacts the p-type region of PV sub-cell 150. As such, the interconnect layer 250 forms a positive terminal for the PV sub-cell string. Preferably, the insulating layers 240 and 244 are formed at the same time, and with the same material and processes as used with respect to the formation of the insulating layer 218. The interconnect layers 250 and 252 are preferably formed at the same time, and with the same material and processes as used with respect to the formation of the interconnect layer 230.

In one embodiment, a ledge or lip may be etched or formed into a sidewall of PV sub-cell to provide an area for electrically connecting the interconnect layer 252 to the PV sub-cell 152. For example, as shown in FIG. 2, a ledge 260 is etched or formed into the PV sub-cell 152 along the sidewall 246, for the interconnect layer 252 to contact the p-type region of PV sub-cell 152.

Once positive and negative terminals have been formed for each of the top-level PV sub-cell strings, a bus bar (negative) 254 may then be used to make an electrical connection between each of the negative terminals of top-level PV sub-cell strings and a bus bar (positive) 256 may be used to make an electrical connection between each of the positive terminals of top-level PV sub-cell strings. As shown in FIGS. 1 and 2, the bus bars 254 and 256 preferably comprise conductive material that is formed on top of, or in contact with, the negative and positive terminals, respectively, of the each of the top-level PV sub-cell strings.

Figure 3:
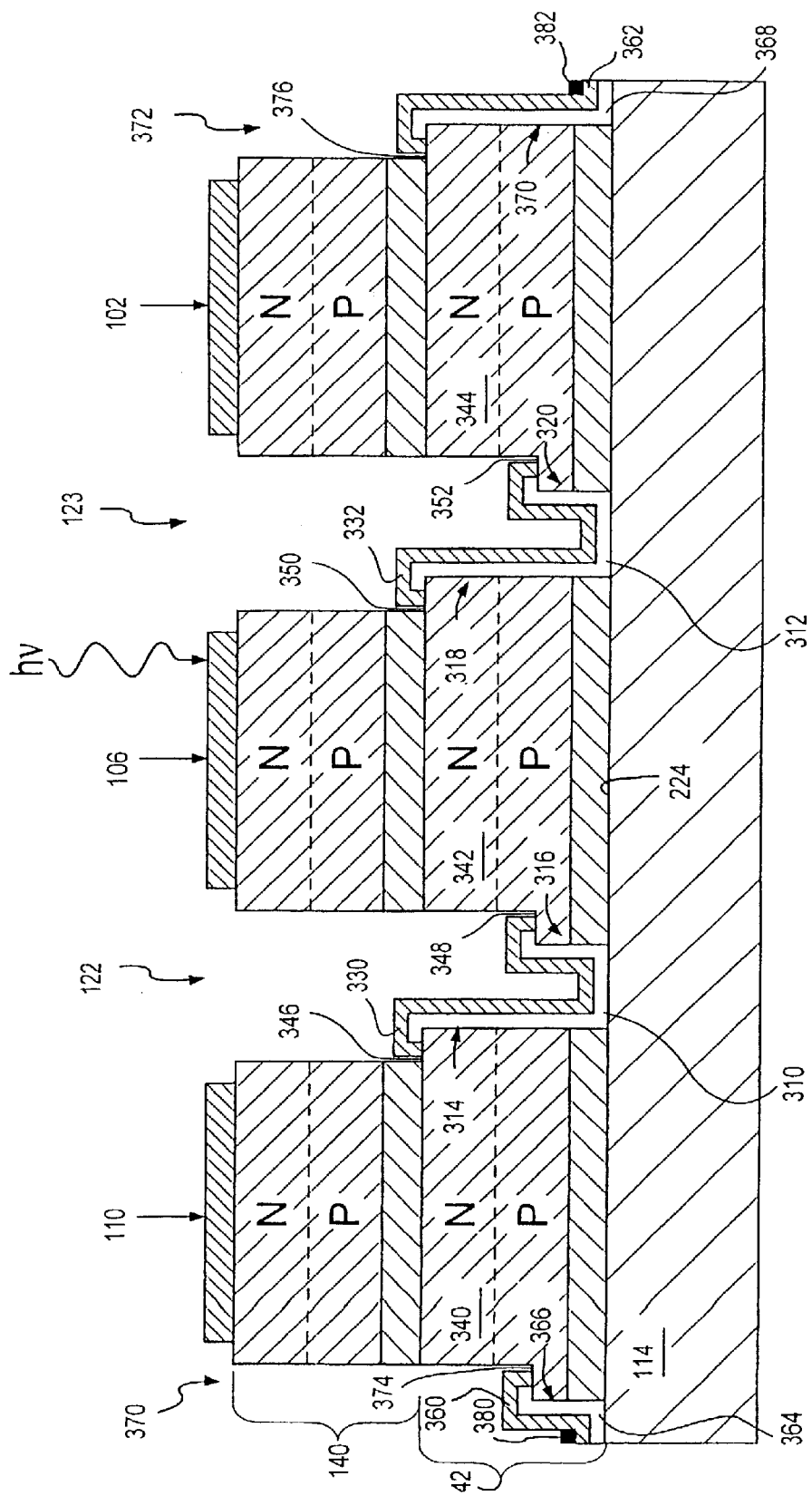
FIG. 3 illustrates a cross-sectional view of the PV cell shown in FIG. 1 taken along the line 3—3, illustrating various electrical connections formed in the PV cell in accordance with the first embodiment of the present invention.

FIG. 3 illustrates a cross-sectional view of the PV cell 100, taken along the line 3—3 shown in FIG. 1. FIG. 3 illustrates, without limitation, one example of electrical interconnections that may be formed in the trenches 122 and 123 between the PV sub-cells in the second PV sub-cell layer 142. In particular, FIG. 3 illustrates one example of electrical interconnections that may be formed in the trenches 122 and 123 between PV sub-cells in the second-layer of PV sub-cell stacks 102, 106, and 110. It should be understood that similar electrical interconnections may be formed in the trenches 122 and 123 between the PV sub-cell stacks 104, 108, and 112 (not shown). Furthermore, it should be understood that that similar electrical interconnections may be formed in trenches separating second-layer PV sub-cells in PV cells containing more than two layers.

The trenches 122 and 123 are preferably etched or formed in the same manner or by the same method or methods as described above with respect to the formation of the trench 121. Once the trenches 122 and 123 have been formed, an insulating layer 310 may be deposited or formed in the trench 122, along the sidewall 314 of the PV sub-cell stack. Similarly, an insulating layer 312 may be deposited or formed in the trench 123, along the sidewalls 320 and 318 of the PV sub-cell stack 102 and 106 respectively. The composition of the insulating layers 310 and 312 is preferably the same as the composition of the insulating layers 218, 240, and 244 previously described with respect to FIG. 2.

Once the insulating layers 310 and 312 have been formed or deposited, an electrically conductive interconnect layer 330 is then deposited in the trench 122, on top of the insulating layer 310, in such a manner that electrical connections are made between PV sub-cells 340 and 342. Similarly, an electrically conductive interconnect 332 is then also deposited in the trench 123, on top of the insulating layer 312, in such a manner that electrical connections are made between PV sub-cells 342 and 344.

In one embodiment, ledges or lips 346, 348, 350, and 352 are etched or formed into sidewalls 314, 316, 318, and 320, respectively, of the PV sub-cell stacks 110, 106, and 102, to provide areas for electrically connecting the interconnect layers 330 and 332 to the appropriate PV sub-cells. For example, as shown in FIG. 3, a ledge 346 is etched or formed into the sidewall 314 of the PV sub-cell stack 110, for the interconnect layer 330 to contact the n-type region of PV sub-cell 340. A ledge 348 is etched or formed into the sidewall 316 of the PV sub-cell stack 106, for the interconnect layer 330 to contact the p-type region of PV sub-cell 342. A ledge 350 is etched or formed into the sidewall 318 of the PV sub-cell stack 106, for the interconnect layer 332 to contact the n-type region of PV sub-cell 342. Finally, a ledge 352 is etched or formed into the sidewall 320 of PV sub-cell stack 102, for the interconnect layer 332 to contact the p-type region of PV sub-cell 344.

FIG. 3 also illustrates how a single positive terminal 360 and a single negative terminal 362 may be formed for a second-level PV sub-cell strings. Again, the second level PV sub-cell string including PV sub-cells 340, 342, and 344 will be used as an example. However, it will be understood that positive and negative terminals for other second-level PV sub-cell strings may be formed in a similar manner. In one embodiment, before forming positive or negative terminals 360 and 362, trenches or channels are formed along sidewalls of the PV sub-cell stacks 110 and 102. For example, as shown in FIG. 3, one channel 370 is formed along sidewall 366 of the PV sub-cell stack 110 and another channel 372 is formed along sidewall 370 of the PV sub-cell stack 102. Preferably, the channels 370 and 372 are formed at the same time, and with the same process or processes used with respect to the formation of the trenches 122 and 123.

To form the positive terminal 360, an insulating layer 364 is first deposited or formed along the sidewall 366 of the PV sub-cell stack 110. The insulating layer 364 may also be formed along the upper surface 224 of the substrate 114, as shown in FIG. 3. Once the insulating layer 364 has been deposited, an electrically conductive interconnect layer 360 is deposited on top of the insulating layer 364. As shown in FIG. 3, a portion of the interconnect layer 360 contacts the p-type region of PV sub-cell 340. As such, the interconnect layer 360 forms the positive terminal for the PV sub-cell string.

To form the negative terminal 362, an insulating layer 368 is first deposited or formed along the sidewall 370 of the PV sub-cell stack 102. The insulating layer 368 may also be formed along the upper surface 224 of the substrate 114, as shown in FIG. 3. Once the insulating layer 368 has been deposited, an electrically conductive interconnect layer 362 is deposited on top of the insulating layer 368. As shown in FIG. 3, a portion of the interconnect layer 362 contacts the n-type region of PV sub-cell 344. As such, the interconnect layer 362 forms the negative terminal for the PV sub-cell string.

In one embodiment, 360 and/or 362 directly contact the PV sub-cells 340 and 344, respectively. For example, as shown in FIG. 3, a ledge 374 is etched or formed into the PV sub-cell 110 along the sidewall 366, for the interconnect layer 360 to contact the p-type region of PV sub-cell 340. Similarly, a ledge 376 is etched or formed into the PV sub-cell 102 along the sidewall 370, for the interconnect layer 362 to contact the n-type region of PV sub-cell 344.

Once positive and negative terminals have been formed for each of the top-level PV sub-cell strings, a bus bar (negative) 380 may then be used to make an electrical connection between each of the negative terminals of the second-level PV sub-cell strings and a bus bar (positive) 382 may be used to make an electrical connection between each of the positive terminals of second-level PV sub-cell strings. As shown in FIGS. 1 and 3, the bus bars 254 and 256 preferably comprise conductive material that is formed on top of, or in contact with, the negative and positive terminals, respectively, of the each of the second-level PV sub-cell strings.

Finally, to form a single two-terminal PV cell, the negative bus bar 254 is electrically connected to the negative bus bar 362, and the positive buts bar 352 is electrically connected to the positive bus bar 360. Connected in this manner, a single, two-terminal, monolithic, tandem PV cell 100 is formed that generates a single, relatively high voltage potential.

As has been described, the precise materials used to fabricate the PV cell 100 may vary. Additionally, the precise methods used in forming the layers of semiconductor material, isolation regions, electrical insulators, and electrical connections, as well as the methods used in forming the trenches and ledges in the PV cell 100 may vary. Additionally, as will be understood to those skilled in the art, the precise order of the process steps involved in forming the trenches, the insulating layers, and the electrical connections in the PV cell 100 may also vary.

As has been described, various embodiments of the present invention relate to voltage-matched, monolithic, tandem PV cells, consisting of multiple PV sub-cell strings. In these various embodiments, the upper surface of the topmost PV sub cell in a PV sub-cell stack has a substantially planar surface that is bounded or defined by the outer circumferential shape of the PV sub-cell stack. Furthermore, the upper surfaces of all of the PV sub-cell stacks in the PV cell define a PV cell upper plane having a particular outer circumferential shape. The relationship of each of the outer circumferential shapes of the PV sub-cell stacks in a PV cell, with respect to the outer circumferential shape of upper plane of the PV cell, is referred to herein as the topology of the select PV cell.

As will be understood, voltage-matched, monolithic, tandem PV cells may have a number of different topologies, depending on the number of sub-cell layers in the PV cell, the outer circumferential shape or shapes of the PV sub-cells in the PV cell, and the outer circumferential shape of the PV cell itself, among other things. As will be appreciated, a great number of different topologies may be used or employed in designing and/or constructing a voltage-matched, monolithic, tandem PV cell in accordance with the present invention. Furthermore, various different geometrical or empirical methods may be used in accordance with the present invention to select or determine a topology for a voltage-matched, monolithic, tandem PV cell. As will be appreciated, one manner in which the selection of a topology for a given voltage-matched, monolithic, tandem PV cell may be simplified, is to impose one set of design constraints on the PV cell. For example, and without limitation, one such set of design constraints, referred to as a select PV cell, will now be described.

The various constraints of the select PV cell will now be defined. First, each of the PV sub-cells in the select PV cell have the same general outer circumferential shape. The outer circumferential shape of each PV sub-cell in the select PV cell includes at least one pair of parallel sides for each PV sub-cell layer in the select PV cell. Each of the PV sub-cell strings in the select PV cell comprises a number of series connected PV sub-cells where each PV sub-cell in a string is on the same PV sub-cell layer. The series connected PV sub-cells in the select PV cell are spatially adjacent to one another, such that all the adjacent PV sub-cells in a PV sub-cell string font one spatial sequence along a single, substantially linear axis (a rigid linear chain). Stated another way, each of the PV sub-cells in a series connected PV sub-cell string is formed along a substantially straight line, with each PV sub-cell in the string being physically adjacent to the other PV sub-cell or cells in the string, to which it is directly electrically connected. Each of the PV sub-cell strings in a given PV sub-cell layer in the select PV cell are parallel with one another.

With these various parameters of the select PV cell in mind, the topological problem faced in designing the select PV cell can be posed as follows: what is the PV cell topology that allows one to divide the PV cell into PV sub-cell stacks, such that each of the PV sub-cell strings on each of the PV sub-cell layers achieves a similar or identical output voltage ($V_{total}$) under illumination.

In a simple embodiment, referred to herein as the simple select PV cell, the PV cell will have only two PV sub-cell layers, a first PV sub-cell layer and a second PV sub-cell layer, and the outer circumferential shape of the select PV cell will be a square. Additionally, the outer circumferential shape of each PV sub-cell in the simple select PV cell will be rectangular. Defined as such, each PV sub-cell string in this simple select PV cell has a unit length of L. Since the simple select PV cell is a square, each of the PV sub-cell strings therein have an identical length L. Furthermore, as each PV sub-cell in the simple select PV cell has an identical rectangular outer circumferential shape, the outer circumferential shape of each PV sub-cell in the simple select PV cell has a first side of length x and a second side of length y. Finally, the number (m) of PV sub-cells in each of the PV sub-cell strings in the first layer will be identical, and the number (n) of PV sub-cells in each of the PV sub-cell strings in the second layer will be identical.

In this simple case, the topology of the simple select PV cell and then be selected or determined if the output voltages ($V_1$) of the individual PV sub-cells in the first PV sub-cell layer and the output voltages ($V_2$) of the individual PV sub-cells the second PV sub-cell layer are known. Since the outer circumferential shape of the simple select PV cell is a square the relationship between the unit length of L, of the simple select PV cell, the length x of the first side of a PV sub-cell, and the length y of the second side of a PV sub-cell may be expressed by the following equation:

$$L = mx = ny \qquad \text{Equation (1)}$$

Since the voltage of every PV sub-cell string in the simple select PV cell is approximately the same ($V_{total}$), and since the voltage of any given PV sub-cell string in the simple select PV cell is equal to the sum of the output voltages of the PV sub-cells in the given PV sub-cell string, the relationship between the PV sub-cell strings in the first PV sub-cell layer and the PV sub-cell strings in the second PV sub-cell layer may be expressed by the following equation:

$$V_{total} = mV_1 = nV_2 \quad \text{Equation (2)}$$

By algebraically manipulating Equation 1 and Equation 2, we may get the following equations:

$$\frac{V_{total}}{L} = \frac{V_1}{x} = \frac{V_2}{y}; \quad \text{Equation (3)}$$

$$x = \frac{V_1 L}{V_{total}}; \quad \text{Equation (4)}$$

$$y = \frac{V_2 L}{V_{total}}; \text{ and} \quad \text{Equation (5)}$$

$$\frac{x}{y} = \frac{V_1}{V_2}. \quad \text{Equation (6)}$$

Given a desired output voltage $V_{total}$ of the PV sub-cell strings, and thus the desired output voltage of the simple select PV cell, the length L of the of the simple select PV cell, and the output voltages $V_1$ and $V_2$ of the individual PV sub-cells in the first PV sub-cell layer and the second PV sub-cell layer, respectively, the lengths of the sides x and y of the individual PV sub-cells, and thus the overall topology of the simple select PV cell may be determined. As will be understood by those skilled in the art, the following equations do not take into account the widths of the trenches that may be used to separate the PV sub-cell stacks, the ledges or lips that may be etched or formed into a sidewalls the PV sub-cells, or the channels that may be formed along the outer circumference of the simple select PV cell to accommodate terminals. However, these factors may be accounted for by factoring the width of the trenches into the x and y values, as is well known in the art.

As will be appreciated, the determination of a select PV cell that is not square, and/or cell that includes more than two PV sub-cell layers, will involve more extensive calculation than have just been described for the simple select PV cell. However, much of the process of determining the topology of a given PV cell having more than two PV sub-cell layers and/or having PV sub-cells with more complex outer circumferential shapes, may be determined using what is commonly referred to as "tiling theory" (See Tilings and Patterns: An Introduction, by Branko Grumgbaum and G. C. Sheppard, W. H. Freeman & Company, 1989, which is herein incorporated by reference in its entirety. As is known, tiling theory relates to closely packing, or tessellating, various two-dimensional shapes in a plane.

As has been described, in various embodiment of the present invention, PV sub-cell strings may be voltage-matched by electrically connecting each of the PV sub-cells of a PV sub-cell string in series. Since, as has been described, the output voltage of a series connected PV sub-cell string under illumination is the sum of the output voltages of the individual PV sub-cells in the PV sub-cell, a precise output voltage of the serially connected PV sub-cell string may be obtained by carefully selecting the number of PV sub-cells in a PV sub-cell string, such that a voltage-matched condition is achieved for each PV sub-cell string in a PV cell. While serially connecting PV sub-cells in PV sub-cell string is one manner of voltage matching the PV sub-cell strings, other methods may be used to accomplish PV sub-cell voltage matching. For example, and without limitation, PV sub-cell string may also be voltage-matched by connecting the PV sub-cells in a PV sub-cell string in some combination of series and parallel electrical connections, as will now be described.

Figure 4:
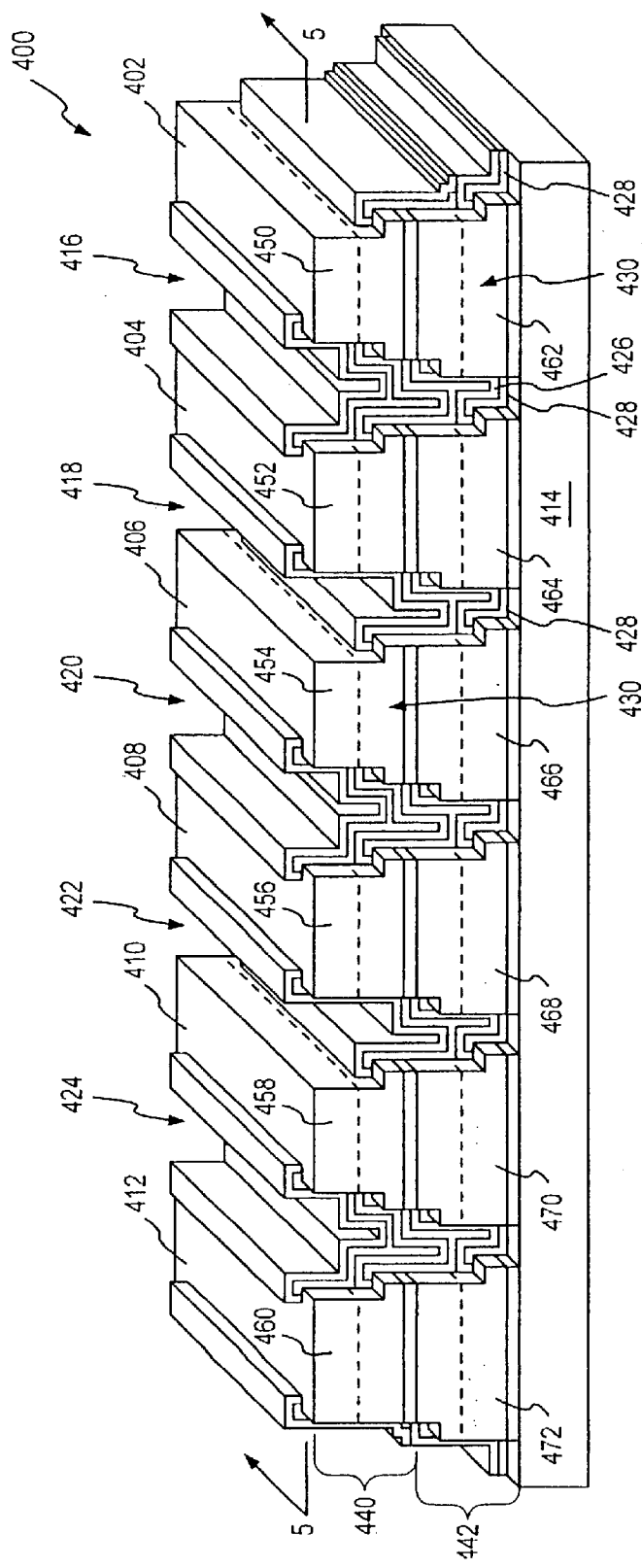
FIG. 4 illustrates a photovoltaic (PV) cell constructed in accordance with a second embodiment of the present invention.

Turning now to FIG. 4, illustrated therein is a simplified embodiment of a two-terminal, tandem, monolithic PV cell 400 in accordance with a second embodiment of the present invention. It should be understood that like the PV cell 100 illustrated in FIG. 1, the PV cell illustrated in FIG. 4 has been simplified so that a basic understanding of some of the main concepts involved with, or incorporated in, various embodiments of this alternative embodiment of the present invention may more easily be understood. Additionally, the dimensions and proportions of the PV cell 400 illustrated in FIG. 4 have been exaggerated. As will be described below in greater detail, the various concepts, features, and techniques that will now be described with respect to the PV cell 400 shown in FIG. 4, may be extended to PV cells having greater numbers of PV sub-cells, greater numbers of PV sub-cell strings, greater numbers of PV sub-cells in a PV sub-cell strings, and/or greater numbers of PV sub-cells in a PV-sub-cell stack. Furthermore, the various concepts, features, and techniques that will now be described with respect to the PV cell 400 may be extended to PV cells having various other shapes.

As illustrated in FIG. 4, the PV cell 400 includes a number of PV sub-cell stacks 402, 404, 406, 408, 410, and 412 situated on a substrate 414. In this second embodiment, the PV-sub-cell stacks 402, 404, 406, 408, 410, and 412 and the substrate 414 together may comprise a single, crystalline tandem device, referred to as a monolithic, tandem device or cell. Alternatively, the PV-sub-cell stacks 402, 404, 406, 408, 410, and 412 may be monolithically grown on other types of substrates, such as, without limitation, glass, steel, molybdenum, sapphire, or any other substance that is suitable for deposition. The monolithic tandem device may be formed in any manner known in the art. For example, and without limitation, the monolithic device may be formed as a number of layers of crystalline material that have been epitaxially deposited (i.e., grown), one on top of the other.

Each of the sub-cell stacks 402, 404, 406, 408, 410, and 412 are physically separated and electrically isolated from one another on the substrate 414 by a number of trenches 416, 418, 420, 422, and 424. As with the PV cell 100, these trenches may be formed in any manner known in the art. As also with the PV cell 100 shown in FIG. 1, the PV cell 400 shown in FIG. 4 is preferably constructed as a single, monolithic, tandem PV cell. As will now be described, the principle functional difference between the PV cell 400 and the PV cell 100 is in the type of electrical connection that are formed in the various voltage-matched PV sub-cell strings within the PV cell.

As shown in FIG. 4, various ones of the PV sub-cells in the various PV sub-cell stacks are electrically interconnected by a number of interconnect layers 426. In one embodiment, these interconnect layers 426 are formed predominantly within the trenches 416, 418, 420, 422, and 424. The various ways in which the PV sub-cells in the PV sub-cell stacks 402, 404, 406, 408, 410, and 412 may be electrically interconnected by the interconnect layers 426 is described in detail below. As also shown in FIG. 4, the interconnect layers 426 may be electrically isolated from one another, from the PV sub-cells, and/or from the substrate 414 by isolation layers 428.

As described, each of the PV sub-cell stacks 402, 404, 406, 408, 410, and 412 in the PV cell 400 includes a number of PV sub-cells 430. Each of the PV sub-cells 430 includes a n-type conductivity region, a p-type conductivity region, and a junction (either n-p or p-n) between the n-type and p-type conductivity regions. In a preferred embodiment, the materials that form each of the PV sub-cells 430 in a PV sub-cell stack will be selected to absorb photons having different energy levels. Stated another way, each PV sub-cell in a PV sub-cell stack will preferably have a different band-gap energy. Additionally, in one embodiment, the PV sub-cells will preferably be arranged in the PV sub-cell stacks according to the band-gap energies of the PV sub-cells, with the PV sub-cell having the highest band-gap energy being located at the top of the stack, the PV sub-cell having the next highest band-gap energy being located below the PV sub-cell having the highest band-gap and so on in descending order of band-gap energies, to the bottom of the PV sub-cell stack. In one embodiment, a PV sub-cell 430 located at the top of the PV sub-cell stack is the PV sub-cell positioned farthest from the substrate 414. In other embodiments, the PV sub-cell located at the top of the PV sub-cell stack is the PV sub-cell positioned closest to the substrate 414.

As described, each of the top PV sub-cells in each of the PV sub-cell stacks 402, 404, 406, 408, 410, and 412 are of a similar material composition and have a similar band-gap energy. As such, each of the top PV sub-cells in each of the PV sub-cell stacks may be said to be in a common PV sub-cell layer, the top PV sub-cell layer 440. Likewise, each of the second PV sub-cells of the PV sub-cell stacks are of a similar material composition and have a similar band-gap energy. As such, each of the second PV sub-cells in each of the PV sub-cell stacks may be said to be in a common PV sub-cell layer, the second PV sub-cell layer 442, and so on. In this second embodiment of the present invention, each sub-cell layer will preferably have a different band-gap energy.

As previously described, in this second embodiment, numbers of individual PV sub-cells 430 in the PV cell 400 are electrically connected to form PV sub-cell strings. In this embodiment, the PV sub-cell strings are formed by electrically connecting PV sub-cells leaving the same band-gap energy. As such, in this embodiment, the PV sub-cell strings in the given PV cell 400 will contain only PV sub-cells from the top PV sub-cell layer 440 or PV sub-cells from the second PV sub-cell layer 442. That is, in this embodiment, the PV sub-cell strings will only include PV sub-cells from a single layer of the PV cell.

As previously noted, in this second embodiment, the PV sub-cells in a PV sub-cell strings will be connected in manner to form a two-terminal PV sub-cell string. As with the PV cell 100, shown in FIG. 1, each of the PV sub-cell strings in the PV cell 400 will preferably generate similar or identical voltage potential under-illumination, thus allowing each of the PV sub-cell strings in the PV cell 400 to be electrically connected in parallel. In particular, the PV cell 400 illustrates an embodiment wherein the individual PV sub-cells in one or more PV sub-cell strings may be electrically connected in some combination of series and parallel connection, as will now be described.

Figure 5:
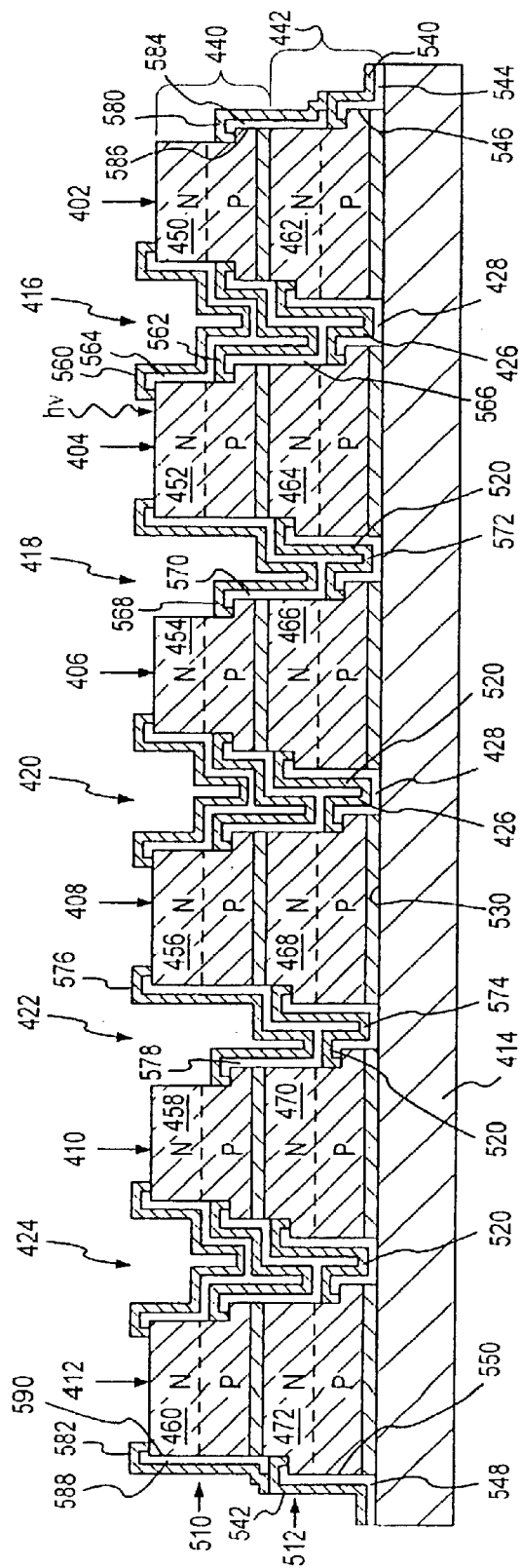
FIG. 5 illustrates a cross-sectional view of the PV cell shown in FIG. 4 taken along the line 5—5, as shown in FIG. 4, illustrating various electrical connections formed in the PV cell in accordance with the second embodiment of the present invention.

Turning now to FIG. 5, illustrated therein is a cross-sectional view of the PV cell 400, taken along the line 5—5 shown in FIG. 4. FIG. 5 illustrates, without limitation, one example of electrical interconnections that may be formed in the trenches 416, 418, 420, 422, and 424 between the PV sub-cells in the PV cell stacks 402, 404, 406, 408, 410, and 412. It should be understood that precise electrical interconnections shown and described with respect to FIG. 5 are illustrative only, and are not intended to show all possible interconnections between PV sub-cells in a PV cell constructed in accordance with this second embodiment of the invention.

As shown in FIG. 5, all of the PV sub-cells in the upper layer 440 of the PV cell 400 are electrically interconnected to form a single, two-terminal, PV sub-cell string 510. Similarly, all of the PV sub-cells in the second layer 442 of the PV cell 400 all electrically interconnected to form a single, two-terminal, sub-cell string 512. However, in contrast to the PV sub-cell strings described above with respect to PV cell 100, each of the PV sub-cell strings in the PV cell 400 are not necessarily composed entirely of series connected sub-cells. For example, as shown in FIG. 5, the PV sub-cell string 510 is composed of a mixture of series connected and parallel connected PV sub-cells. In contrast to the PV sub-cell string 510, the PV sub-cell string 512 is composed entirely of series connected PV sub-cells. By providing different electrical interconnections between the PV sub-cells in the PV sub-cell string 510 and in the PV sub-cell string 512, the two PV sub-cell strings (510 and 512) can be made to achieve an identical or similar PV sub-cell string output voltage under illumination, even though both PV sub-cell strings contain the same number of PV sub-cells and even though the PV sub-cells in the PV sub-cell string 510 have a different band-gap energy than the PV sub-cells in the PV sub-cell string 512.

As has been previously described, when each of the PV sub-cells in a PV sub-cell string is connected in series in this manner, each PV sub-cell string will generate a voltage potential ($V_{sub-cell}$) when under illumination that is equal to the sum ($V_{string}$) of the voltage potentials of each of the PV sub-cells in the PV sub-cell string. In contrast, as previously described, when each of the PV sub-cells in a PV sub-cell string is connected in parallel, the PV sub-cell string will generate a voltage potential ($V_{sub-cell}$) when under illumination is equal to the voltage potential ($V_{sub-cell}$) generated by any one of any single PV sub-cell under illumination the PV sub-cell string, assuming each of the PV sub-cells in the PV sub-cell string generate identical output voltages under illumination. As will be described, this second embodiment of the present invention takes advantage of these relationships between the types of electrical connections used in forming a PV sub-cell string, and the resulting voltage outputs that can be achieved using a combination of these connections to achieve voltage matching between the PV sub-cell strings in the PV cell 400.

Returning now to FIG. 5, as shown therein, each of the PV sub-cells in the PV sub-cell string 512 are electrically connected in series via a number of interconnect layers 520 extending between the PV sub-cells 462, 464, 466, 468, 470, and 472, in the trenches 416, 418, 420, 422, and 424. In particular, all interconnect layer 426 is formed in contact between the n-type layer of the PV sub-cell 462 and the p-type layer of the PV sub-cell 464. As shown, similar series connections are formed between the PV sub-cells 464 and 466, between PV sub-cells 466 and 468, between PV sub-cells 468 and 470, and between PV sub-cells 470 and 472. As also shown in FIG. 5, insulating layers 428 are preferably formed in the trenches between the interconnect layers 426 and between sidewalls of the PV sub-cells 462, 464, 466, 468, 470, and 472 and along an upper surface 530 of the substrate 514 to provide appropriate electrical isolation, in a similar manner to that described above with respect to PV cell 100. Again, as described above with respect to PV cell 00, the insulating layer 428 may comprise any number of materials that are used in the art for providing electrical insulation in semiconductor devices and which may be deposited in a relatively uniform manner and thickness on semiconductor materials.

The PV sub-cell string 512 includes a positive terminal 540 and a negative terminal 542. As shown in FIG. 5, the positive terminal 540 of the PV sub-cell string 512 may be formed of electrically conducting material, such as interconnect material, in connection with the p-type layer of the PV sub-cell 462. Similarly, the negative terminal 542 of the PV sub-cell string 512 may be formed in connection with the n-type layer of the PV sub-cell 472. Additionally, an insulating layer 544 is preferably formed beneath the positive terminal 540 and between a sidewall 546 of the PV sub-cell 462 and along the upper surface 530 of the substrate 514 to provide appropriate electrical isolation for the positive terminal 540. An insulating layer 548 is also preferably formed beneath the negative terminal 542 and between a sidewall 550 of the PV sub-cell 472 and along the upper surface 530 of the substrate 514 to provide appropriate electrical isolation for the negative terminal 540. Formed in this manner, the series interconnected PV sub-cell string 512 will generate an output voltage under illumination between the positive terminal 540 and the negative terminal 542 that is equal to the sum of the output voltages of the PV sub-cells 462, 464, 466, 468, 470, and 472. For example, and without limitation, if each of the PV sub-cells in the PV sub-cell string 512 were to achieve an output voltage under illumination of 1 volt, the output voltage between the positive terminal 540 and the negative terminal 542 of the PV sub-cell string 512 would be approximately 6 volts.

As shown in FIG. 5, the PV sub-cell string 510 is composed of a mixture of series connected and parallel connected PV sub-cells. As will be understood, the particular combination of series and parallel connections made between the various PV sub-cells in the PV sub-cell string 510 will preferably be selected such that the output voltage of the PV sub-cell string 510 is identical to the output voltage of the PV sub-cell string 512. As such, in order to properly select the appropriate combination of series and parallel connections made between the various PV sub-cells in the PV sub-cell string 510 the output voltage of each of the PV sub-cells 450, 452, 544, 556, 458, and 460, as well as the output voltage of the PV sub-cell string 512, must be known. Once the voltages of each of the PV sub-cells 450, 452, 454, 456, 458, and 460 and the PV sub-cell string 512 are known, the appropriate combination of series and parallel connections may be determined for the PV sub-cell string 510, such that the output voltage of the PV sub-cell string 510 will match the output voltage of the PV sub-cell string 512.

In order to provide an example of how the appropriate combination of series and parallel connections may be determined for the PV sub-cell string 510, it will be assumed for explanation purposes only, and without limitation, that each of the PV sub-cells 450, 452, 544, 556, 458, and 460 of the PV sub-cell string 510 achieve an output voltage under illumination of 2 volts, and that the PV sub-cell string 512 achieve an output voltage under illumination of 6 volts. Using these assumed voltages, it may be determined that one way to achieve an output voltage for the PV sub-cell string 510 of 6 volts, three pairs of PV sub-cells in the PV sub-cell string 510 may be electrically connected in parallel. In this way, each of the pairs of parallel connected PV sub-cell strings will achieve an output voltage under illumination of 2 volts. These three pairs of parallel connected PV sub-cells may then be electrically connected in series to form a total output voltage for the PV sub-cell 510 of 6 volts. Sub-cell string 510 illustrates the series electrical connection of three pairs of parallel connected PV sub-cell strings as just described.

As shown in FIG. 5, PV sub-cells 450 and 452 are connected in parallel via a pair of electrical interconnect layers 560 and 562 extending between the PV sub-cells 450 and 452 in the trench 416. In particular, the interconnect layer 560 is in electrical contact with, and extends between, the n-type regions in the PV sub-cells 450 and 452, while the interconnect layer 562 is in electrical contact with, and extends between, the p-type regions in the PV sub-cells 450 and 452. An insulating layer 564 is preferably formed between the interconnect layers 560 and 562 to provide appropriate electrical isolation between the interconnect layers 550 and 562, as well as between the interconnect layer 560 and the adjacent PV sub-cells 450 and 452. An isolation layer 566 is also preferably formed between the interconnect layers 562 and 426 to provide appropriate electrical isolation between the interconnect layers 562 and 426, as well as between the interconnect layer 562 and the adjacent PV sub-cells 462 and 464. PV sub-cells 454 and 456, as well as PV sub-cells 458 and 460, are also electrically connected in parallel in a similar manner as that just described with respect to PV sub-cells 454 and 456.

To complete the electrical interconnection of the PV sub-cells in the PV sub-cell string 510, series electrical connections are preferably formed between the parallel PV sub-cell pairs. For example, as shown, to provide a series electrical connection between the parallel connected PV sub-cell 450 and 452, and the parallel connected PV sub-cell 454 and 456, an electrical interconnect 568 is formed between the n-type region of the PV sub-cell 452 and the p-type region of PV sub-cell 454. An insulating, layer 570 is preferably formed between the interconnect layers 568 and 572 to provide appropriate electrical isolation between the interconnect layers 568 and 572, as well as between the interconnect layer 568 all the PV sub-cells 452, 554, 564, and 566. To provide a series electrical connection between the parallel connected PV sub-cell 454 and 456, and the parallel connected PV sub-cell 458 and 460, an electrical interconnect 576 is formed between the n-type region of the PV sub-cell 456 and the p-type region of PV sub-cell 458. An insulating layer 578 is preferably formed between the interconnect layers 576 and 574 to provide appropriate electrical isolation between the interconnect layers 576 and 574, as well as between the interconnect layer 576 and the PV sub-cells 456, 558, 568, and 570.

The PV sub-cell string 510 includes a positive terminal 580 and a negative terminal 582. As shown in FIG. 5, the positive terminal 580 of the PV sub-cell string 510 may be formed of conductive material, such as interconnect, in connection with the p-type layer of the PV sub-cell 450 and the positive terminal 540 of the PV sub-cell string 512. Connected in this manner, the positive terminal 580 of the PV sub-cell string 510 together with the positive terminal 540 of the PV sub-cell string 512 form the positive terminal of the PV cell 400. Similarly, the negative terminal 582 of the PV sub-cell string 510 may be formed in connection with the n-type layer of the PV sub-cell 460 and the negative terminal 542 of the PV sub-cell string 512. Connected in this manner, the negative terminal 582 of the PV sub-cell string 510 together with the negative terminal 542 of the PV sub-cell string 512 form the negative terminal of the PV cell 400.

Additionally, an insulating layer 584 is preferably formed between the positive terminal 580 and the sidewalls 586 and 546 of the PV sub-cells 450 and 462, respectively, to provide appropriate electrical isolation for the positive terminal 580. An insulating layer 588 is also preferably formed between the negative terminal 582 and a sidewall 590 of the PV sub-cell 460, to provide appropriate electrical isolation for the negative terminal 582. Formed in this manner, the combination series and parallel interconnected PV sub-cell string 510 will generate an output voltage under illumination between the positive terminal 580 and the negative terminal 582 that is equal to the sum of the output voltages of each of the parallel connected PV sub-cell pairs, or approximately 6 volts. Furthermore, since the PV sub-cell strings 510 and 512 are electrically connected in parallel, with the negative terminal of the PV sub-cell string 510 connected to the negative terminal of the PV sub-cell string 512 and the positive terminal of the PV sub-cell string 510 connected to the positive terminal of the PV sub-cell string 512, the total output voltage achieved by the PV cell 400 under illumination will be 6 volts.

Again, it will be understood that the particular electrical connections described and shown for the two PV sub-cell strings 510 and 512 of the PV sub-cell 400 are illustrative only. Those skilled in the art will appreciate that various PV sub-cells formed in accordance with this second embodiment of the invention nay have addition sub-cell layers, additional numbers of PV sub-cells in the PV sub-cell strings that comprise the PV cell, as well as other combinations of series and parallel electrical connections between the various PV sub-cells in any of the PV sub-cell strings that comprise the PV cell, as long as each PV sub-cell strings in the PV sub-cell are voltage-matched.

Figure 6:
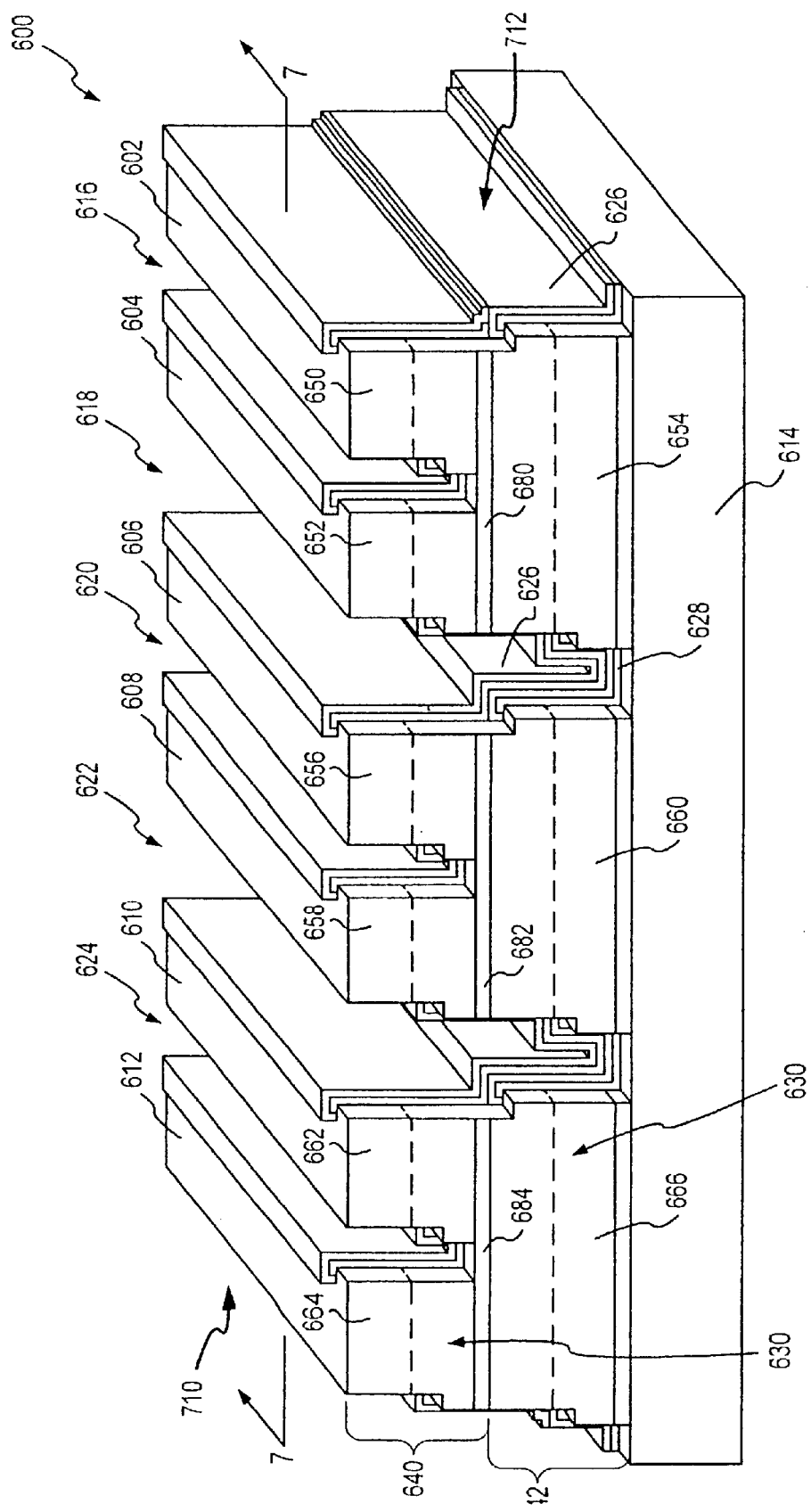
FIG. 6 illustrates a photovoltaic (PV) cell constructed in accordance with a third embodiment of the present invention.

Turning now to FIG. 6, illustrated therein is a simplified embodiment of a two-terminal, tandem, monolithic PV cell 600 in accordance with a third embodiment of the present invention. It should be understood that like the PV cells 100 and 400, the PV cell 600 illustrated in FIG. 6 has been simplified so that a basic understanding of some of the main concepts involved with, or incorporated in, various embodiments of this alternative embodiment of the present invention may more easily be understood. Additionally, the dimensions and proportions of the PV cell 600 have been exaggerated for illustration purposes. As will be described below in greater detail, the various concepts, features, and techniques that will now be described with respect to the PV cell 600, may be extended to PV cells having greater numbers of PV sub-cells, greater numbers of PV sub-cell strings, greater numbers of PV sub-cells in a PV sub-cell strings, and/or greater numbers of PV sub-cells in a PV-sub-cell stack. Furthermore, the various concepts, features, and techniques that will now be described with respect to the PV cell 600 may be extended to PV cells having various other shapes.

As illustrated in FIG. 6, the PV cell 600 includes a number of PV sub-cell stacks 602, 604, 606, 608, 610, and 612 situated on a substrate 614. In this third embodiment, the PV-sub-cell stacks 602, 604, 606, 608, 610, and 612 and the substrate 614 together may comprise a single, crystalline, tandem device, referred to as a monolithic, tandem device or cell. Alternatively, the PV-sub-cell stacks 602, 604, 606, 608, 610, and 612 may be monolithically grown on other types of substrates, such as, without limitations glass, steel, molybdenum, sapphire, or any other substance that is suitable for deposition. As shown in FIG. 6, various ones of the PV sub-cells in the various PV sub-cell stacks are electrically interconnected by a number of interconnect layers 626. In one embodiment, these interconnect layers 626 are formed predominantly within the trenches 616, 618, 620, 622, and 624. The various ways in which the PV sub-cells in the PV sub-cell stacks 602, 604, 606, 608, 610, and 612 may be electrically interconnected by the interconnect layers 626 is described in detail below. As also shown in FIG. 6, the interconnect layers 626 may be electrically isolated from one another, from the PV sub-cells and/or from the substrate 614 by isolation layers 628.

As described, each of the PV sub-cell stacks 602, 604, 606, 608, 610, and 612 in the PV cell 600 includes a number of PV sub-cells 630. Each of the PV sub-cells 630 includes a n-type conductivity region, a p-type conductivity region, and a junction (either np or p-n) between the n-type and p-type conductivity regions. In this third embodiment, the materials that form each of the PV sub-cells 630 in a PV sub-cell stack will be selected to absorb photons having different energy levels. Stated another way, each PV sub-cell in a PV sub-cell stack will preferably have a different band-gap energy. Additionally, in this embodiment, the PV sub-cells will preferably be arranged in the PV sub-cell stacks according to the band-gap energies of the PV sub-cells, with the PV sub-cell having the highest band-gap energy being located at the top of the stack, the PV sub-cell having the next highest band-gap energy being located below the PV sub-cell having the highest band-gap, and so on in descending order of band-gap energies, to the bottom of the PV sub-cell stack. In this embodiment, a PV sub-cells 630 located at the top of the PV sub-cell stack are the PV sub-cells positioned farthest from the substrate 614. In other embodiments, the PV sub-cell located at the top of the PV sub-cell stack is the PV sub-cell positioned closest to the substrate 614.

As described, each of the top PV sub-cells in each of the PV sub-cell stacks 602, 604, 606, 608, 610, and 612 are of a similar material composition and have a similar band-gap energy. As such, each of the top PV sub-cells in each of the PV sub-cell stacks may be said to be in a common PV sub-cell layer, the top PV sub-cell layer 640. Likewise, each of the second PV sub-cells of the PV sub-cell stacks are of a similar material composition and have a similar band-gap energy. As such, each of the second PV sub-cells in each of the PV sub-cell stacks may be said to be in a common PV sub-cell layer, the second PV sub-cell layer 642, and so on. In this third embodiment of the present invention, each sub-cell layer will preferably have a different band-gap energy.

As previously described, in this third embodiment, numbers of individual PV sub-cells 630 in the PV cell 600 are electrically connected to form PV sub-cell strings. In this embodiment, the PV sub-cell strings are formed by electrically connecting PV sub-cells having the same band-gap energy. As such, in this embodiment, the PV sub-cell strings in the given PV cell 600 will contain only PV sub-cells from the top PV sub-cell layer 640 or PV sub-cells from the second PV sub-cell layer 642. That is, in tills embodiment, the PV sub-cell strings will only include PV sub-cells from a single layer of the PV cell.

As previously noted, in this third embodiment, the PV sub-cells in a PV sub-cell strings will be connected in manner to form a two-terminal PV sub-cell string. As with the PV cells 100 and 400, each of the PV sub-cell strings in the PV cell 600 will preferably be generate similar or identical voltage potential under illumination, thus allowing each of the PV sub-cell strings in the PV cell 600 to be electrically connected in parallel. In particular, the PV cell 600 illustrates an embodiment wherein the individual PV sub-cells in each of the PV sub-cell strings are electrically connected in series, as will now be described.

As described, the PV cell 600 includes a number of PV sub-cell stacks 602, 604, 606, 608, 610, and 612 situated on the substrate 614. Each of the sub-cell stacks 602, 604, 606, 608, 610, and 612 are at least partially physically separated and electrically-isolated from one another by a number of trenches 616, 618, 620, 622, and 624. As with the PV cells 100 and 400, these trenches may be formed in any manner known in the art. However, it will be noted that unlike the PV cells 100 and 400 previously described, each of the PV sub-cell stacks in this third embodiment of the present invention are not entirely physically separated by trenches. That is, in this third embodiment of the present invention, two or more PV sub-cell stacks may share a common PV sub-cell.

Figure 7:
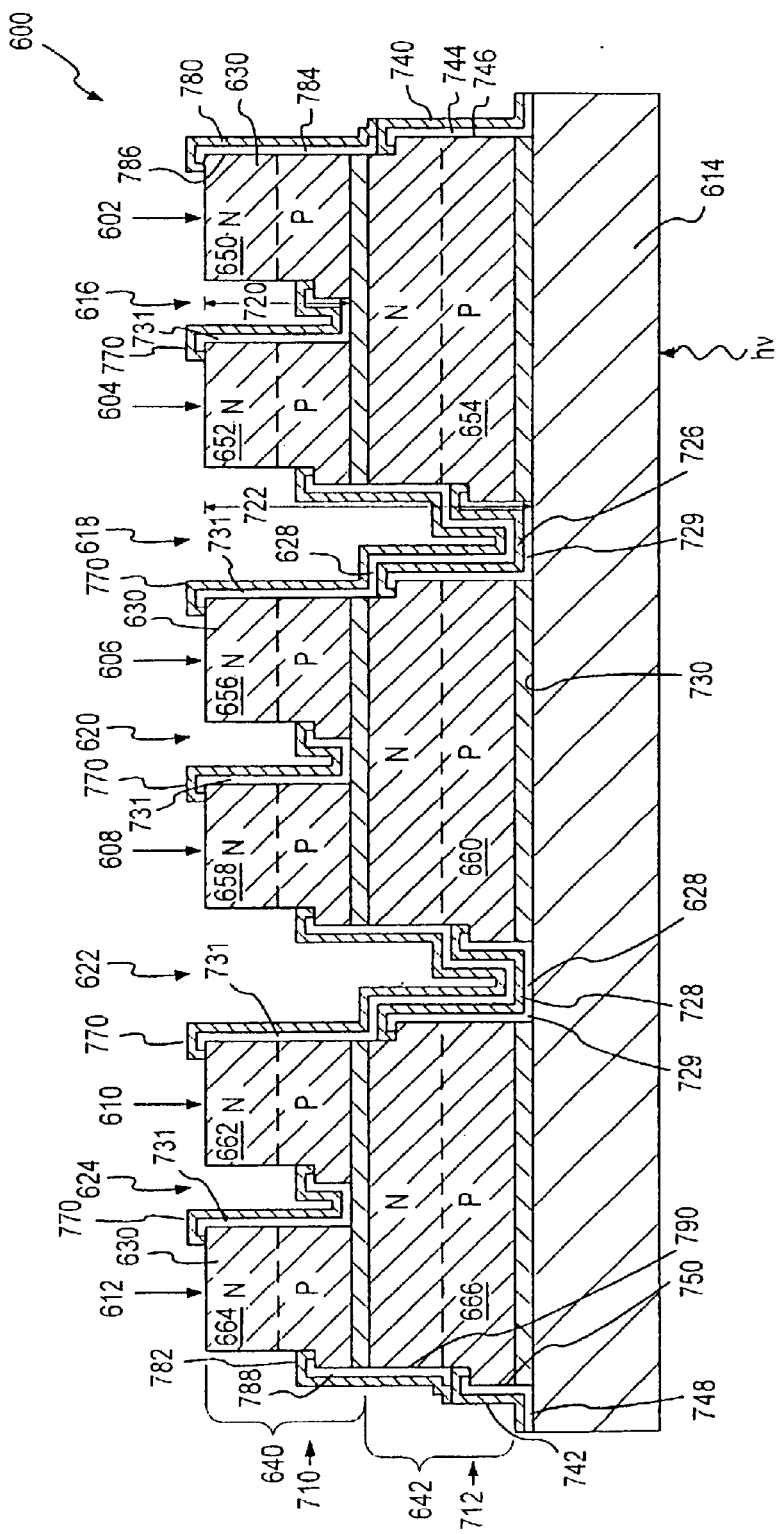
FIG. 7 illustrates a cross-sectional view of the PV cell shown in FIG. 6 taken along the line 7—7, is shown in FIG. 6, illustrating various electrical connections formed in the PV cell in accordance with the third embodiment of the present invention.

As shown in FIG. 6, the sharing of a common PV sub-cell between two or more PV sub-cell stacks may be accomplished by varying the depth of the trenches that separate the various PV sub-cell stacks. For example, as shown in FIG. 7, trenches 616, 620, and 624 are formed to a first depth 720 that does not extend down into the lower PV sub-cell layer 642. In contrast, trenches 618 and 622 are formed to a second depth 722 that does extend down into and trough the lower PV sub-cell layer 642 to the substrate 614. Formed in this manner, the PV sub-cell stack 602 shares a common lower PV sub-cell 654 with the PV sub-cell stack 604, the PV sub-cell stack 606 shares a common lower PV sub-cell 660 with the PV sub-cell stack 608, and the PV sub-cell stack 610 shares a common lower PV sub-cell 666 with the PV sub-cell stack 612.

Turning now to FIG. 7, illustrated therein is a cross-sectional view of the PV cell 600, taken along the line 7—7 shown in FIG. 6. FIG. 7 illustrates, without limitation, one example of electrical interconnections that may be formed in the trenches 616, 618, 620, 622, and 624 between the PV sub-cells in the PV cell stacks 602, 604, 606, 608, 610, and 612. It should be understood that precise electrical interconnections shown and described with respect to FIG. 7 are illustrative only, and are not intended to illustrate all possible interconnections between PV sub-cells in a PV cell constricted in accordance with this third embodiment of the invention.

As shown in FIG. 7, all of the PV sub-cells in the upper layer 640 of the PV cell 600 are electrically interconnected in series to forth a single, two-terminal PV sub-cell string 710. Similarly, all of the PV sub-cells in the second layer 642 of the PV cell 600 all electrically interconnected in series to form a single, two-terminal, sub-cell string 712. However, in contrast to the PV sub-cell strings described above with respect to PV cell 400, each of the PV sub-cell strings in the PV cell 700 are not necessarily composed of the same number of PV sub-cells. For example, as shown in FIG. 7, the PV sub-cell string 710 is composed of six series connected PV sub-cells 602, 604, 606, 608, 601, and 612, while the PV sub-cell string 712 is composed of three series connected PV sub-cells 654, 660, and 666. By providing different numbers of serially connected PV sub-cells in the PV sub-cell string 710 and in the PV sub-cell string 712, the two PV sub-cell strings (710 and 712) can be made to achieve an identical or similar PV sub-cell string output voltage under illumination, even though both PV sub-cell strings contain PV sub-cells having different band-gap energies.

As has been previously described, when each of the PV sub-cells in a PV sub-cell string is connected in series in this manner, each PV sub-cell string will generate a voltage potential ($V_{sub-cell}$) when under illumination that is equal to the sum ($V_{string}$) of the voltage potentials of each of the PV sub-cells in the PV sub-cell string. This third embodiment of the present invention takes advantage of these varying number of PV-sub-cells in each of the PV sub-cell strings, and the resulting voltage outputs that can be achieved by varying the number of PV sub-cells in a PV sub-cell string, to achieve voltage matching between the PV sub-cell strings in the PV cell 600.

As will be appreciated, since the PV sub-cell string contains fewer PV sub-cells than the PV sub-cell string 710, the PV sub-cell string 712 must necessarily include PV sub-cells having a higher band-gap energy than the PV sub-cells in the PV sub-cell string 710, so that the PV sub-cell strings 710 and 712 may be voltage matched. Arranged in this manner, it is preferable to orient the PV cell 600 in an "inverted" manner, such that photons will contact the PV sub-cells in PV sub-cell string 712 before contacting the PV sub-cells in the PV sub-cell string 710. In such a case, it the substrate 614 will preferably be formed of a material that is substantially transparent to the photons of the energy that will be absorbed by the PV cell 600.

Returning now to FIG. 7, as shown therein, each of the PV sub-cells in the PV sub-cell string 712 are electrically connected in series via a number of interconnect layers extending between the PV sub-cells in the trenches 618 and 622. In particular, an interconnect layer 726 is formed in contact between the p-type layer of the PV sub-cell 654 and the n-type layer of the PV sub-cell 660. Likewise, an interconnect layer 728 is formed in contact between the p-type layer of the PV sub-cell 660 and the n-type layer of the PV sub-cell 666. As also shown in FIG. 7, insulating layers 729 are preferably formed in the trenches between the interconnect layers 726 and 728 and between sidewalls of the PV sub-cells 654, 660 and 666 and along an upper surface 730 of the substrate 614 to provide appropriate electrical isolation, in a similar manner to that described above with respect to PV cells 100 and 400. Again, as described above with respect to PV cells 100 and 400, the insulating layer 729 may comprise any number of materials that are used in the art for providing electrical insulation in semiconductor devices and which may be deposited in a relatively uniform manner and thickness on semiconductor materials.

The PV sub-cell string 712 includes a negative terminal 740 and a positive terminal 742. As shown in FIG. 7, the negative terminal 740 of the PV sub-cell string 712 may be formed of electrically conductive material, such as interconnect material, in connection with the n-type layer of the PV sub-cell 654. Similarly, the positive terminal 742 of the PV sub-cell string 712 may be formed in connection with the p-type layer of the PV sub-cell 666. Additionally, an insulating layer 744 is preferably formed between the negative terminal 740 and a sidewall 746 of the PV sub-cell 654, and along the upper surface 730 of the substrate 714 to provide appropriate electrical isolation for the negative terminal 740. An insulating layer 748 is also preferably formed beneath the positive terminal 742 and between a sidewall 750 of the PV sub-cell 666 and along the upper surface 730 of the substrate 614 to provide appropriate electrical isolation for the positive terminal 740. Formed in this manner, the series interconnected PV sub-cell string 712 will generate an output voltage under illumination between the negative terminal 740 and the positive terminal 742 that is equal to the sum of the output voltages of the PV sub-cells 654, 660, and 666.

As shown in FIG. 7, the PV sub-cell string 710 is also composed of series connected PV sub-cells. As shown, each of the PV sub-cells in the PV sub-cell string 710 are electrically connected in series via a number of interconnect 770 layers extending between the PV sub-cells 650 and 652, between PV sub-cells 652 and 656, between PV sub-cells 656 and 658, between PV sub-cells 658 and 662, and between PV sub-cells 662 and 664, in the trenches 616, 618, 620, 622, and 624, respectively. As also shown in FIG. 7, insulating layers 731 are preferably formed in the trenches between the interconnect layers 626 and between sidewalls of the PV sub-cells and between the various interconnect layers to provide appropriate electrical isolation, in a similar manner to that described above with respect to PV cells 100 and 400. Again, as described above with respect to PV cells 100 and 400, the insulating layers 731 may comprise any number of materials that ale used in the art for providing electrical insulation in semiconductor devices and which may be deposited in a relatively uniform manner and thickness on semiconductor materials.

The PV sub-cell string 710 includes a positive terminal 780 and a negative terminal 782. As shown in FIG. 7, the negative terminal 780 of the PV sub-cell string 710 may be formed of electrically conductive material, such as interconnect material, in connection with the n-type layer of the PV sub-cell 650 and the negative terminal 740 of the PV sub-cell string 712. Connected in this manner, the negative terminal 780 of the PV sub-cell string 710, together with the negative terminal 740 of the PV sub-cell string 712 form the negative terminal of the PV cell 600. Similarly, the positive terminal 782 of the PV sub-cell string 710 may be formed in connection with the L-type layer of the PV sub-cell 600 and the positive terminal 742 of the PV sub-cell string 712. Connected in this manner, the positive terminal 782 of the PV sub-cell string 710, together with the positive terminal 742 of the PV sub-cell string 712 forth the negative terminal of the PV cell 600.

Additionally, an insulating layer 784 is preferably formed between the negative terminal 780 and the sidewalls 786 and 746 of the PV sub-cells 650 and 654, respectively, to provide appropriate electrical isolation for the negative terminal 780. An insulating layer 788 is also preferably formed between the positive terminal 782 and the sidewalls 790 and 750 of the PV sub-cells 664 and 666, respectively, to provide appropriate electrical isolation for the positive terminal 782. Formed in this manner, the series interconnected PV sub-cell string 710 will generate and output voltage under illumination between the positive terminal 780 and the negative terminal 782 that is equal to the sum of the output voltages of each of the PV sub-cells in the PV sub-cell string, or approximately 6 volts. Furthermore, since the PV sub-cell strings 710 and 712 are electrically connected in parallel, with the negative terminal of the PV sub-cell string 710 connected to the negative terminal of the PV sub-cell string 712 and the positive terminal of the PV sub-cell string 710 connected to the positive terminal of the PV sub-cell string 712, the total output voltage achieved by the PV cell 600 under illumination will be 6 volts.

As will be understood, the particular number of PV sub-cells in the PV sub-cell string 710 will preferably be selected such that the output voltage of the PV sub-cell string 710 is identical to the output voltage of the PV sub-cell string 712. As previously described, the manner in which a given number of PV sub-cells in the PV sub-cell string 710 may be achieved is by selectively etching the number and depths of the trenches between PV sub-cell stacks such that a given number of upper layer 640 and lower layer 742 PV sub-cells will be formed.

In order to properly select the given number of upper layer 640 and lower layer 642 PV sub-cells to be formed the output voltage of each of the PV sub-cells in the PV sub-cells in the upper layer 640, the output voltage of the PV sub-cells in the lower 642, as well as the desired output voltage of the PV cell 600 must be know. Once these output voltages are known, the appropriate number of PV sub-cell for each sub-cell string in the PV cell 600 may be calculated using the following equation:

$$V_{total} = mV_1 = nV_2 \qquad \text{Equation (7)}$$

Where $V_{total}$ equals the desired output voltage of the PV cell 600, m is an integer number of PV sub-cells in the PV sub-cell string 710, $V_1$ is the output voltage of each of the PV sub-cells in the PV sub-cell string 710, n is an integer number of PV sub-cells in the PV sub-cell string 712, and $V_2$ is the output voltage of each of the PV sub-cells in the PV sub-cell string 712. Once the number of PV sub-cells in each PV sub-cell strings has been determined, the number and depth of the trenches may then be calculated to achieve these determined numbers of PV sub-cells in each PV sub-cell strings. It will be understood that the process for determining numbers of PV sub-cells in each PV sub-cell strings and the number and depth of the trenches that must be formed may be easily extended to cover PV cells, that have greater than two PV sub-cell layers and/or greater than two PV sub-cell strings. Furthermore, it will be understood that various PV sub-cells formed in accordance with this third embodiment of the invention may have addition sub-cell layers, additional numbers of PV sub-cells in the PV sub-cell strings that comprise the PV cell, as well as other combinations of series and parallel electrical connections between the various PV sub-cells in any of the PV sub-cell strings that comprise the PV cell, as long as each PV sub-cell strings in the PV sub-cell are voltage-matched.

Figure 8:
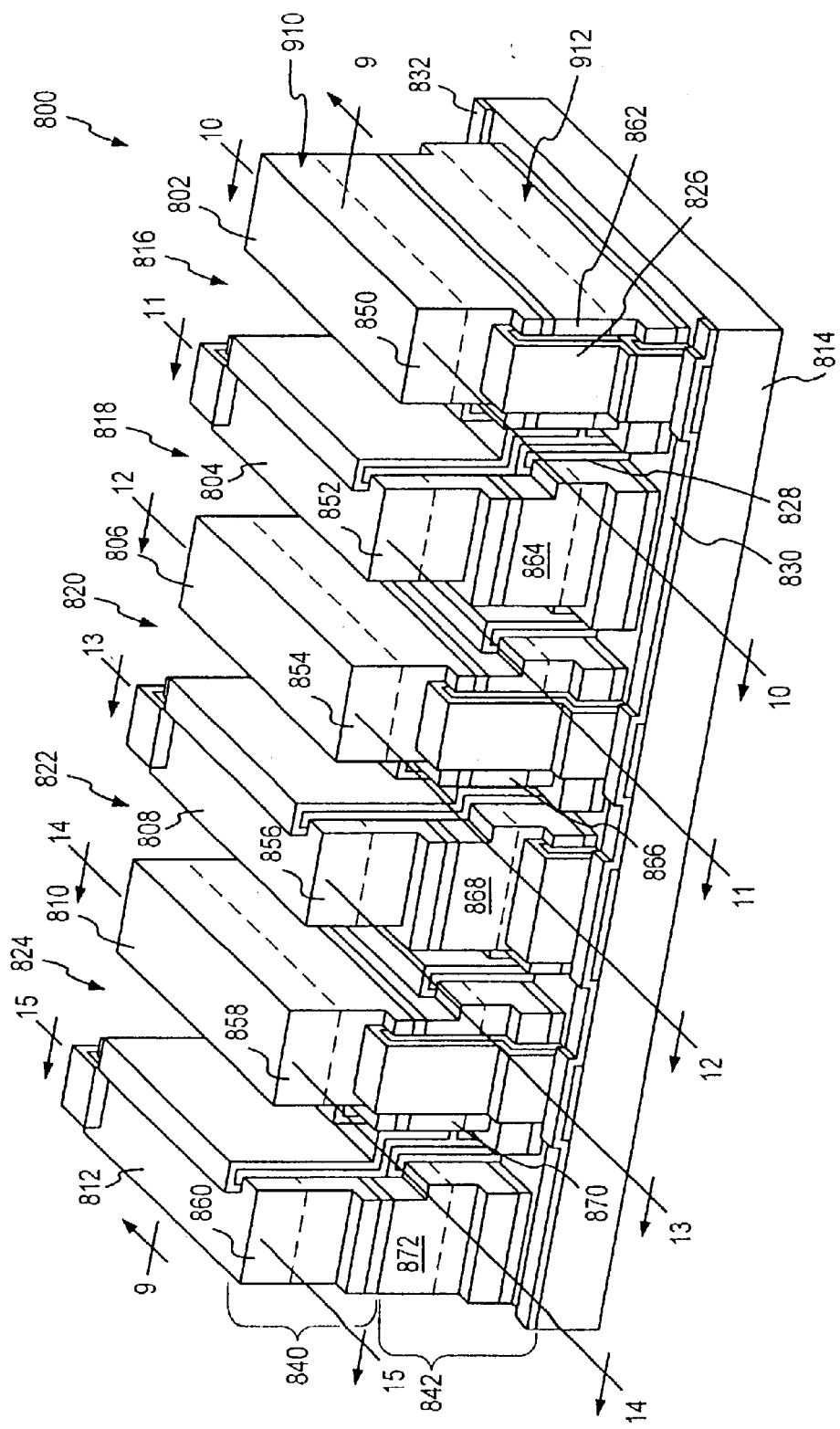
FIG. 8 illustrates a photovoltaic (PV) cell constructed in accordance with a fourth embodiment of the present invention.

Turning now to FIG. 8, illustrated therein is a simplified embodiment of a two-terminal, tandem, monolithic PV cell 800 in accordance with a fourth embodiment of the present invention. It should be understood that like the PV cells 100, 400, and 600, the PV cell 800 illustrated in FIG. 8 has been simplified so that a basic understanding of some of the main concepts involved with, or incorporated in, various embodiments of this fourth embodiment of the present invention may more easily be understood. Additionally, the dimensions and proportions of the PV cell 800 have been exaggerated for illustration purposes. As will be described below in greater detail, the various concepts, features, and techniques that will now be described with respect to the PV cell 800, may be extended to PV cells having greater numbers of PV sub-cells, greater numbers of PV sub-cell strings, greater numbers of PV sub-cells in a PV sub-cell strings, and/or greater numbers of PV sub-cells in a PV-sub-cell stack. Furthermore, the various concepts, features, and techniques that will now be described with respect to the PV cell 800 may be extended to PV cells having various other shapes.

As illustrated in FIG. 8, the PV cell 800 includes a number of PV sub-cell stacks 802, 804, 806, 808, 810, and 812 situated on a substrate 814. In this forth embodiment, the PV-sub-cell stacks 802, 804, 806, 808, 810, and 812 and the substrate 814 together may comprise a single, crystalline, tandem device, referred to as a monolithic, tandem device or cell. Alternatively, the PV-sub-cell stacks 802, 804, 806, 808, 810, and 812 may be monolithically grown on other types of substrates, such as, without limitation, glass, steel, molybdenum, sapphire, or any other substance that is suitable for deposition. As shown in FIG. 8, various ones of the PV sub-cells in the various PV sub-cell stacks ale electrically interconnected by a number of interconnect layers 826. In one embodiment these interconnect layers 826 are formed predominantly within the trenches 816, 818, 820, 822, and 824. The various ways in which the PV sub-cells in the PV sub-cell stacks 802, 804, 806, 808, 810, and 812 may be electrically interconnected by the interconnect layers 826 is described in detail below. As also shown in FIG. 8, the interconnect layers 826 may be electrically isolated from one another, from the PV sub-cells, and/or from the substrate 814 by isolation layers 828.

As described, each of the PV sub-cell stacks 802, 804, 806, 808, 810, and 812 in the PV cell 800 includes a number of PV sub-cells 830. Each of the PV sub-cells 830 includes a n-type conductivity region, a p-type conductivity region, and a junction (either np or p-n) between the n-type and p-type conductivity regions. In this fourth embodiment, the materials that form each of to the PV sub-cells 830 in a PV sub-cell stack will be selected to absorb photons having different energy levels. Stated another way, each PV sub-cell in a PV sub-cell stack will preferably have a different band-gap energy. Additionally, in this embodiment, the PV sub-cells will preferably be arranged in the PV sub-cell stacks according to the band-gap energies of the PV sub-cells, with the PV sub-cell having the highest band-gap energy being located at the top of the stack, the PV sub-cell having the next highest band-gap energy being located below the PV sub-cell having the highest band-gap, and so on in descending order of band-gap energies, to the bottom of the PV sub-cell stack. In this embodiment, a PV sub-cells 830 located at the top of the PV sub-cell stack are the PV sub-cells positioned farthest from the substrate 814. In other embodiments, the PV sub-cell located at the top of the PV sub-cell stack is the PV sub-cell positioned closest to the substrate 814.

As described, each of the top PV sub-cells in each of the PV sub-cell stacks 802, 804, 806, 808, 810, and 812 are of a similar material composition and have a similar band-gap energy. As such, each of the top PV sub-cells in each of the PV sub-cell stacks may be said to be in a common PV sub-cell layer, the top PV sub-cell layer 840. Likewise, each of the second PV sub-cells of the PV sub-cell stacks are of a similar material composition and have a similar band-gap energy. As such, each of the second PV sub-cells in each of the PV sub-cell stacks may be said to be in a common PV sub-cell layer, the second PV sub-cell layer 842, and so on. In this fourth embodiment of the present invention, each sub-cell layer will preferably have a different band-gap energy.

As previously described, in this fourth embodiment, numbers of individual PV sub-cells 830 in the PV cell 800 are electrically connected to focal PV sub-cell strings. In this embodiment, the PV sub-cell strings are formed by electrically connecting PV sub-cells having the same band-gap energy. As such, in this embodiment, the PV sub-cell strings in the given PV cell 600 will contain only PV sub-cells from the top PV sub-cell layer 840 or PV sub-cells from the second PV sub-cell layer 842. That is, in this embodiment, the PV sub-cell strings will only include PV sub-cells from a single layer of the PV cell.

As previously noted, in this fourth embodiment, the PV sub-cells in a PV sub-cell strings will be connected in manner to form a two-terminal PV sub-cell string. As with the PV cells 100, 400, and 600, each of the PV sub-cell strings in the PV cell 800 will preferably be generate similar or identical voltage potential under illumination, thus allowing each of the PV sub-cell strings in the PV cell 800 to be electrically connected in parallel.

As shown, each of the PV sub-cell strings 910 and 912 include the same number of PV sub-cells. Since the individual PV sub-cells in the PV sub-cell string 910 generate a different output voltage under illumination than the individual PV sub-cells in the PV sub-cell string 912, in order to voltage match the PV sub-cell strings 910 and 912 either one or both of the PV sub-cell strings 910 and 912 must use something other than a strict series interconnection scheme. In this fourth embodiment of the present invention, the interconnection scheme that is used involves dividing up one or more of the PV sub-cell strings into two or more PV sub-cell sub-strings, wherein each PV sub-cell sub-string includes two or more serially connect PV sub-cells, and connecting each of these PV sub-cell sub-strings together in parallel via positive and negative bus bars to produce a two-terminal PV sub-cell string. By carefully selecting the number of PV sub-cells in each of the PV sub-cell sub-strings, as well as the number of PV sub-cell sub-strings the PV sub-cell strings, the various PV sub-cell strings in the PV cell 800 can be voltage-matched.

Figure 9:
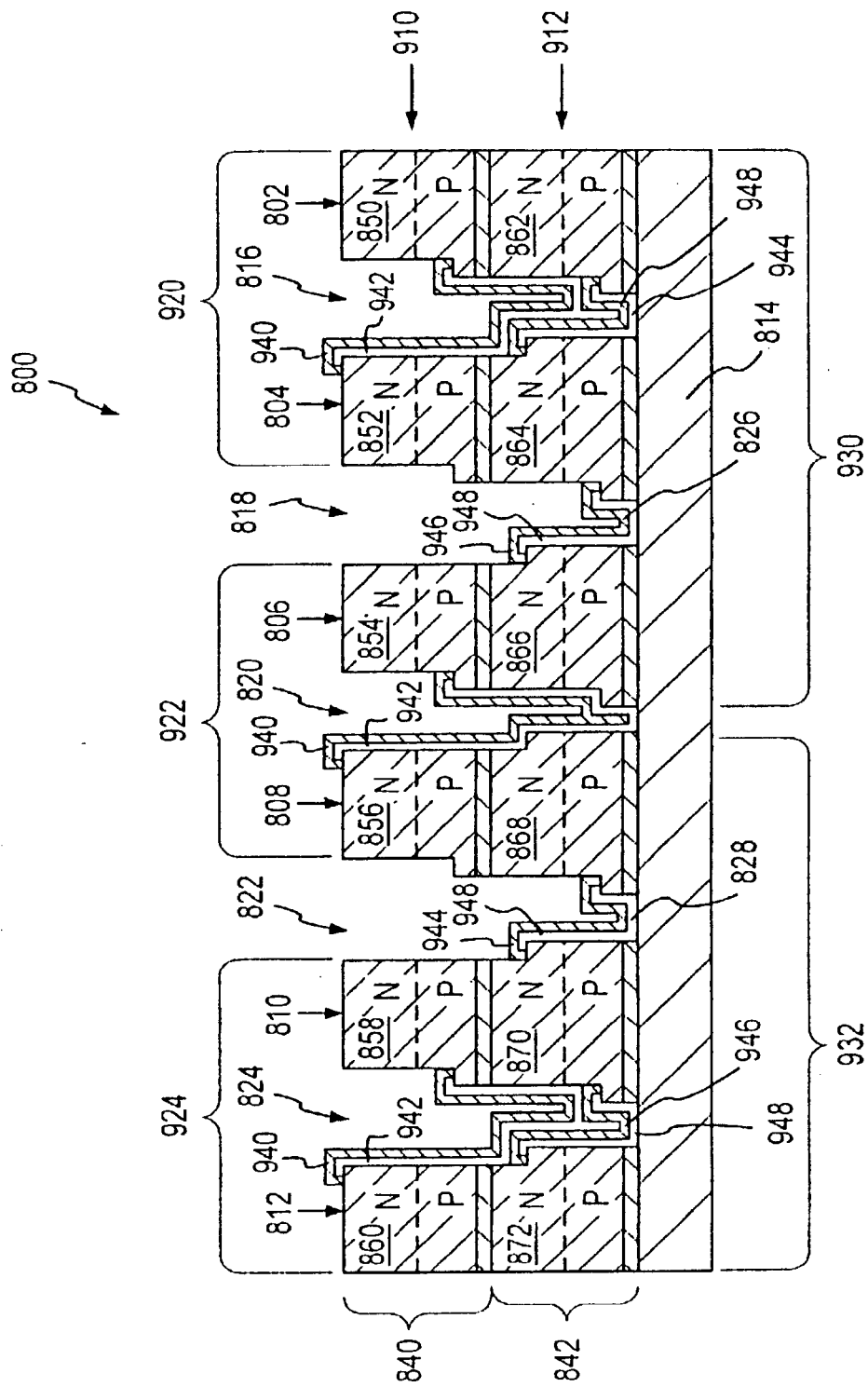
FIG. 9 illustrates a cross-sectional view of the PV cell shown in FIG. 8 taken along the line 9—9, as shown in FIG. 8, illustrating various electrical connections formed in the PV cell in accordance with the fourth embodiment of the present invention.

As shown in FIG. 9, each of the PV cell 800 is composed of two PV sub-cell strings 910 and 912. Furthermore, each of the PV sub-cell strings 910 and 912 are composed of two or more PV sub-cell sub-strings, where a PV sub-cell sub-string may defined as two or more PV sub-cells connected in series. For example, as shown in FIG. 9, the PV sub-cell string 910 is composed of three PV sub-cell sub-strings 920, 922, and 924, with PV sub cell sub-string 920 including PV sub cells 850 and 852 electrically connected in series, PV sub cell sub-string 922 including PV sub cells 854 and 856 electrically connected in series, aid PV sub cell sub-string 924 including PV sub-cells 858 and 860 electrically connected in series. In turn, each of the PV sub-cell sub-strings 920, 922, and 924 in the PV sub-cell cell string 910 are then electrically connected in parallel via positive and negative bus bars 830 and 832, respectively. Similarly, the PV sub-cell string 912 is composed of two PV sub-cell sub-strings 930 and 932, with PV sub cell sub-string 930 including PV sub cells 862, 864, and 866 electrically connected in series and PV sub cell sub-string 932 including PV sub cells 868, 870, and 872 electrically connected in series. In turn, each of the PV sub-cell sub-strings 930 and 932 in the PV sub-cell cell string 912 are then electrically connected in parallel via the positive and negative bus bars 830 and 832, respectively. By electrically connecting both the PV sub-cell string 910 and the PV sub-cell string 912 together via the bus bars, 830 and 832, a two-terminal PV cell 800 is created.

Turning now more particularly to the detail of PV cell 800, as described, the PV cell 800 includes a number of PV sub-cell stacks 802, 804, 806, 808, 810, and 812 situated on a substrate 814. Each of the sub-cell stacks 802, 804, 806, 808, 810, and 812 are separated and electrically isolated from one another by a number of trenches 816, 818, 820, 822, and 824. As with the PV cells 100, 400, and 600, these trenches may be formed in any manner known in the art. It is within these trenches that the series connections are preferably formed between the various PV sub-cells in the PV sub-cell sub strings in this embodiment of the invention.

FIG. 9, illustrates a cross-sectional view of the PV cell 800, taken along the line 9—9 shown in FIG. 8. FIG. 8 illustrates, without limitation, one example of electrical interconnections that may be formed in the trenches 816, 818, 820, 822, and 824 between the PV sub-cells in the PV sub-cell sub-strings 920, 922, 924, 930, and 932. It should be understood that precise electrical interconnections shown and described with respect to FIG. 9 are illustrative only, and are not intended to illustrate all possible interconnections between PV sub-cells in a PV cell constructed in accordance with this fourth embodiment of the invention.

As shown in FIG. 9, PV sub-cell sub-strings 920, 922, and 924 each contain two PV sub-cells connected in series. For example, PV sub-cell sub-string 920 includes PV sub-cells 850 and 852. As shown, the PV sub-cells 850 and 852 are electrically connected via an interconnect layer 940 formed in the trench 816 and extending between the p-type region of PV sub-cell 850 and the n-type region of PV sub-cell 852. As shown, a similar series connections are formed between the PV sub-cells 854 and 856 in PV sub-cell sub-sting 922, and between PV sub-cells 858 and 860 in PV sub-cell sub-sting 924. As also shown in FIG. 9, insulating layers 942 are preferably formed in the trenches between the interconnect layers 922 below the interconnect layers 940 to provide appropriate electrical isolation, in a similar manner to that described above with respect to PV cells 100, 400, 600. Again, as described above with respect to PV cells 100, 400, and 600, the insulating layer 942 may comprise any number of materials that are used in the art for providing electrical insulation in semiconductor devices and which may be deposited in a relatively uniform manner and thickness on semiconductor materials.

As shown in FIG. 9, PV sub-cell sub-strings 930 and 932 each contain three PV sub-cells connected in series. For example, PV sub-cell sub-string 930 includes PV sub-cells 862, 864, and 866. As shown, the PV sub-cells 862 and 864 are electrically connected via all interconnect layer 944 formed in the trench 816 and extending between the p-type region of PV sub-cell 862 and the n-type region of PV sub-cell 864 similarly TV sub-cells 864 and 866 are electrically connected via an interconnect layer 946 formed in the trench 818 and extending between the p-type region of PV sub-cell 864 and the n-type region of PV sub-cell 866. As also shown in FIG. 9, insulating, layers 948 are preferably formed in the trenches below the interconnect layers 944 and 946 to provide appropriate electrical isolation, in a similar manner to that described above with respect to PV cells 100, 400, 600. As shown, similar series connections and isolating layers are formed between the PV sub-cells 868, 870 and 872 in the PV sub-cell sub-sting 932.

As previously described, each of the PV sub-cell sub-strings 920, 922, and 924 in the PV sub-cell string 910 are electrically connected in parallel via bus bars 830 and 832. Similarly, each of the PV sub-cell sub-strings 930 and 932 in the PV sub-cell string 912 are electrically connected in parallel via bus bars 830 and 832. The connections of the various PV sub-cell sub-strings to the bus bars 830 and 832 will now be shown and described with respect to FIGS. 10–15.

Figures 10, 11:
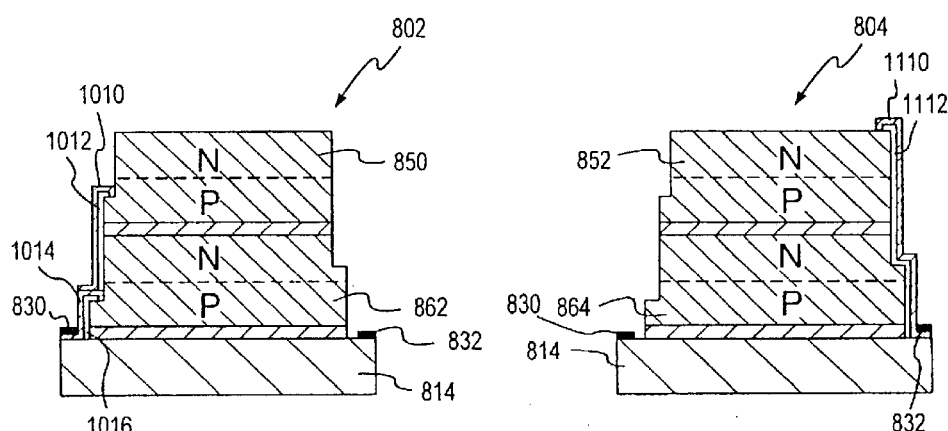
FIG. 10 illustrates a cross-sectional view of the PV cell shown in FIG. 8 taken along the line 10—10, as shown in FIG. 8, illustrating various electrical connections formed in the PV cell in accordance with the fourth embodiment of the present invention.
FIG. 11 illustrates a cross-sectional view of the PV cell shown in FIG. 8 taken along the line 11—11, as shown in FIG. 8, illustrating various electrical connections formed in the PV cell in accordance with the fourth embodiment of the present invention.

FIG. 10, illustrates a cross-sectional view of the PV cell 800, taken along the line 10—10 shown in FIG. 8. As shown in FIG. 10, a positive terminal for the PV sub-cell sub-string 930 is formed in connection to the positive bus bar 830 of the PV cell 800 by forming an interconnect layer 1014 in connection with the p-type layer of the PV sub-cell 862 and the bus bar 830. An insulating layer 1016 is also preferably formed beneath the interconnect layer 1014 and between to provide appropriate electrical isolation. Similarly, a positive terminal for the PV sub-cell sub-string 920 is formed in connection to the interconnect layer 1014, and thus in electrical connection with the bus bar 830, by forming an interconnect layer 1010 in connection with the p-type layer of the PV sub-cell 850 and the interconnect layer 1014. An insulating layer 1012 is also preferably formed beneath the interconnect layer 1010 to provide appropriate electrical isolation.

FIG. 11, illustrates a cross-sectional view of the PV cell 800, taken along the line 11—11 shown in FIG. 8. As shown in FIG. 11, a negative terminal for the PV sub-cell sub-string 920 is formed in connection to the negative bus bar 832 of the PV cell 800 by forming an interconnect layer 1110 in connection with the n-type layer of the PV sub-cell 852 and the bus bar 832. An insulating layer 1112 is also preferably formed beneath the interconnect layer 1110 to provide appropriate electrical isolation.

Figures 12, 13:
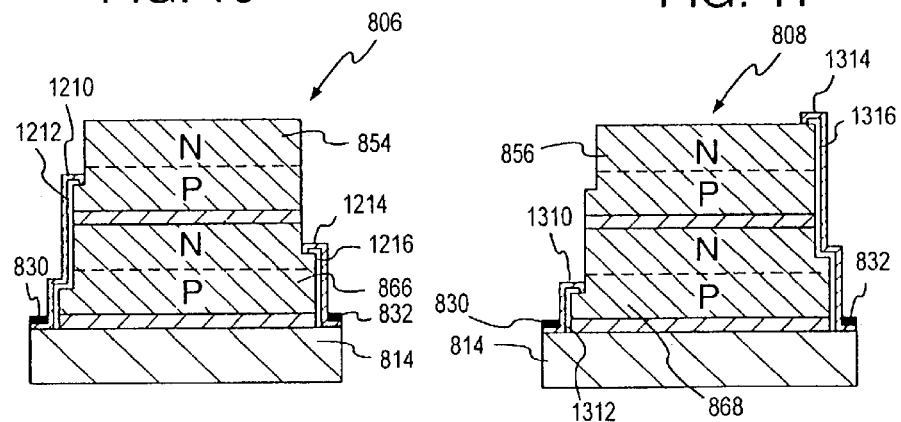
FIG. 12 illustrates a cross-sectional view of the PV cell shown in FIG. 8 taken along the line 12—12, as shown in FIG. 8, illustrating various electrical connections formed in the PV cell in accordance with the fourth embodiment of the present invention.
FIG. 13 illustrates a cross-sectional view of the PV cell shown in FIG. 8 taken along the line 13—13, as shown in FIG. 8, illustrating various electrical connections formed in the PV cell in accordance with the fourth embodiment of the present invention.

FIG. 12, illustrates a cross-sectional view of-the PV cell 800, taken along the line 12—12 shown in FIG. 8. As shown in FIG. 12, a positive terminal for the PV sub-cell sub-string 922 is formed in connection to the positive bits bar 830 of the PV cell 800 by forming an interconnect layer 1210 in connection with the p-type layer of the PV sub-cell 854 and the positive bus bar 830. An insulating layer 1212 is also preferably formed beneath the interconnect layer 1110 and between to provide appropriate electrical isolation. As also shown in FIG. 12, a negative terminal for the PV sub-cell sub-string 930 is formed in connection to the negative bus bar 832 of the PV cell 800 by forming an interconnect layer 1214 in connection with the n-type layer of the PV sub-cell 866 and the negative bus bar 832. An insulating layer 1216 is also preferably formed beneath the interconnect layer 1214 to provide appropriate electrical isolation.

FIG. 13, illustrates a cross-sectional view of the PV cell 800, taken along the line 13—13 shown in FIG. 8. As shown in FIG. 13, a positive terminal for the PV sub-cell sub-string 930 is formed in connection to the positive bus bar 830 of the PV cell 800 by forming an interconnect layer 1310 in connection with the p-type layer of the PV sub-cell 868 and the positive bus bar 830. An insulating layer 1312 is also preferably formed beneath the interconnect layer 1310 and between to provide appropriate electrical isolation. As also shown in FIG. 13, a negative terminal for the PV sub-cell sub-string 922 is formed in connection to the negative bus bar 832 of the PV cell 800 by forming an interconnect layer 1314 in connection with the in-type layer of the PV sub-cell 856 and the negative bus bar 832. An insulating layer 1316 is also preferably formed beneath the interconnect layer 1314 to provide appropriate electrical isolation.

Figure 14:
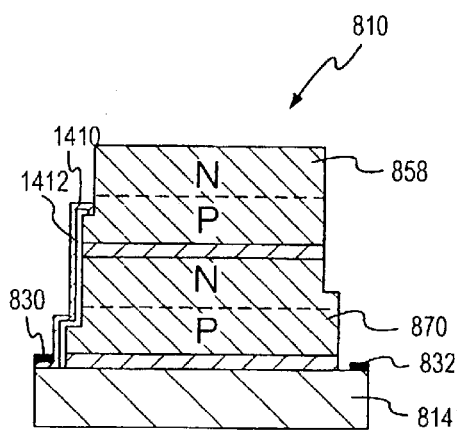
FIG. 14 illustrates a cross-sectional view of the PV cell shown in FIG. 8 taken along the line 14—14, as shown in FIG. 8, illustrating various electrical connections formed in the PV cell in accordance with the fourth embodiment of the present invention.

FIG. 14, illustrates a cross-sectional view of the PV cell 800, taken along the line 14—14 shown in FIG. 8. As shown in FIG. 14, a positive terminal for the PV sub-cell sub-string 924 is formed in connection to the positive bus bar 830 of the PV cell 800 by forming an interconnect layer 1410 in connection with the p-type layer of the PV sub-cell 858 and the positive bus bar 830. An insulating layer 1412 is also preferably formed beneath the interconnect layer 1110 and between to provide appropriate electrical isolation.

Figure 15:
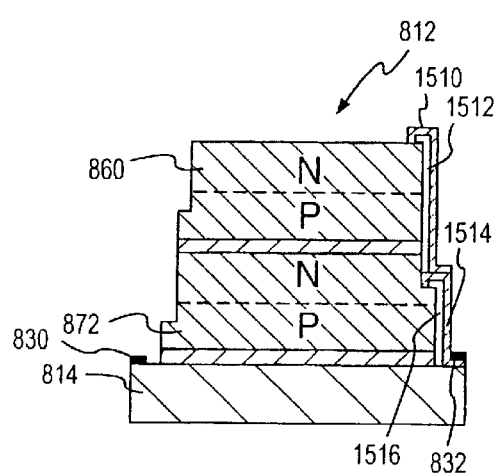
FIG. 15 illustrates a cross-sectional view of the PV cell shown in FIG. 8 taken along the line 15—15, as shown in FIG. 8, illustrating various electrical connections formed in the PV cell in accordance with the fourth embodiment of the present invention.

FIG. 15, illustrates a cross-sectional view of the PV cell 800, taken along the line 15—15 shown in FIG. 8. As shown in FIG. 15, a negative terminal for the PV sub-cell sub-string 932 is formed in connection to the negative bus bar 832 of the PV cell 800 by forming an interconnect layer 1514 in connection with the n-type layer of the PV sub-cell 872 and the bus bar 832. An insulating layer 1516 is also prefer-ably formed beneath the interconnect layer 1514 and between to provide appropriate electrical isolation. Similarly, a negative terminal for the PV sub-cell sub-string 924 is formed in connection to the interconnect layer 1514, and thus in electrical connection with the bus bar 832, by forming and interconnect layer 1510 in connection with the n-type layer of the PV sub-cell 860 and the interconnect layer 1514. An insulating layer 1512 is also preferably formed beneath the interconnect layer 1510 to provide appropriate electrical isolation.

As described, in accordance with this the fourth embodiment of the present invention, a PV cell may be divided into a number of PV sub-cell strings, where each of the PV sub-cell strings includes the same number of PV sub-cells.

As also describe, in this embodiment, one or more of the PV sub-cell strings in the PV cell is further into two or more PV sub-cell sub-strings, wherein each PV sub-cell sub-string includes two or more serially connect PV sub-cells. Finally, by carefully selecting the number of PV sub-cells in the PV sub-cell sub-strings, as well as the number of PV sub-cell sub-strings in the PV sub-cells, and by selectively connecting the various PV sub-cell sub-strings and PV sub-cell strings together via positive and negative bus bars, a two-terminal PV cell device may be constructed wherein each of the PV sub-cell strings in the PV cell are voltage-matched.

As has been described, the present invention relates to various methods and devices which allow a two terminal, monolithic, tandem PV cell to be created having a number of voltage-matched PV sub-cell strings. In particular four separate embodiments have been described for forming and electrically interconnecting PV cells in accordance with the present invention. While these four different embodiments have been described separately, one skilled in the art will appreciate that the various formations and interconnections described with respect to these four embodiments may be combined in whole or in part into other PV cells in accordance with the present invention. Additionally, while the various embodiments of the present invention have been described with respect to their use or functioning as PV cells, those skilled in the art will appreciate that the semiconductor structures and electrical interconnection schemes described in herein may also be used for or in conjunction with other photonic devices. For example, and without limitation, the various embodiments of the present invention described herein may be used for producing light emitting diode (LED) devices.

LED devices, like the PV cells so far described, typically include an n-type conductivity region, a p-type conductivity region, and a junction (either np or p-n) between the n-type and p-type conductivity regions. However, instead of being used to produce an output voltage, LED cells are used to produce photons, or light, when a voltage is applied across the LED cell. When a given LED cell is subjected to a forward bias greater than the band-gap energy of the given cell, electrons will move from the n-type region on one side of the LED cell's junction to the p-type region on the other side of the junction. Once an electron (negative charge) arrives in the p-type region, it will be attracted to, and recombine with, a hole (positive charge) in the p-type region. Each time an electron and a hole recombine a photon is emitted.

The energy level of a photon that is emitted from an LED cell, and thus the color of the light that is emitted, is dependent on the band-gap energy of the material from which the LED cell is made. In order to generate photons in a given LED cell, an appropriate voltage, higher than the hand-gap energy of the LED cell must be applied to the cell.

While each of the embodiments of the PV cells so far described have been discussed solely with respect to PV devices, each of these embodiments may be also be used in a similar manner to construct two-terminal, monolithic, tandem, LED devices having multiple, horizontally stacked LED cells, where the voltage is applied, rather than developed, at the output terminal of a cell. For example, in any of the previously described embodiments, the various sub-cell layers may each be formed of a semiconductor material that is appropriate to produce photons of-a different given energy. The various series and parallel interconnection combinations described with respect to the embodiments above may then be used to assure that an appropriate bias voltage is established across each of the sub-cells, in each of the sub-cell layers of the LED device. For example, with respect to the first and third embodiments described above, each sub-cell string may be selected to have an appropriate number of series connected sub-cells such that an appropriate bias voltage is applied to each of the sub-cells in a string when a single bias voltage is applied to an LED device. With respect to the second embodiment described above, each sub-cell string may be selected to have an appropriate number of series and parallel connected sub-cells such that an appropriate bias voltage is applied to each of the sub-cells in a string when a single bias voltage is applied to and LED device. With respect to the fourth embodiment described above, each sub-cell string may be selected to have an appropriate number of series connected sub-cell sub-strings sub-cells such that an appropriate bias voltage is applied to each of the sub-cells in a string when a single bias voltage is applied to an LED device. Finally, various combinations of the methods and connections described above with respect to the various embodiments may be used in part and/or in combination to produce LED cells in accordance with the present invention.

In the case where each sub-cell layer in an LED cell are each formed of a semiconductor material that is appropriate to produce photons of a different given energy (color), one particularly useful variation on the various embodiments listed above is to provide a separate bias source for each sub-cell string in a given sub-cell layer. In this way, the amount of current flowing through each sub-cell in a given string can be controlled. By controlling the amount of current in a LED sub-cell, the number of photons emitted may be controlled and, thus, the intensity of the light emitted. By varying the amount of photons (intensity) on each of the sub-cells in the sub-cell stack, the overall perceived color or hue emitted by the stack may be varied. This is particular useful, for example, where it is desired to produce white light.

It will be clear that the invention is well adapted to attain the ends and advantages mentioned as well is those inherent therein. While at presently preferred embodiment has been described for purposes of this disclosure, various changes and modifications may be made which are well within the scope of the invention. Numerous other changes may be made which will readily suggest themselves to those skilled in the art and which are encompassed in the spirit of the invention disclosed herein and as defined in the appended claims. The entire disclosure and all publications cited hereby are hereby incorporated by reference.

What is claimed is:

1. A two-terminal, monolithic, tandem photonic device comprising:
   a first layer of semiconductor material having an n-type region, a p-type region, and a first band-gap energy;
   a plurality of first layer sub-cells formed in the first layer and electrically connected in series to form a two-terminal first layer sub-cell string;
   a second layer of semiconductor material having an n-type region, a p-type region, and a second band-gap energy; and
   a plurality of second layer sub-cells formed in the second layer and electrically connected in series to form a two-terminal second layer sub-cell, wherein the first layer sub-cell string and the second layer sub-cell string are electrically connected in parallel to form the two-terminal, monolithic, tandem photonic device.

2. A two-terminal, monolithic, tandem photonic device as defined in claim 1, wherein each sub-cell in the first layer of semiconductor material has substantially the same outer circumferential shape.

3. A two-terminal, monolithic, tandem photonic device as defined in claim 2, wherein each sub-cell in the second layer of semiconductor material has substantially the same outer circumferential shape.

4. A two-terminal, monolithic, tandem photonic device as defined in claim 3, wherein the outer circumferential shapes of the first layer sub-cells and the second layer sub-cells are substantially the same shape.

5. A two-terminal, monolithic, tandem photonic device as defined in claim 1, wherein the first layer of semiconductor material and the second layer of semiconductor material are formed epitaxially on a substrate.

6. A two-terminal, monolithic, tandem photonic device as defined in claim 1, wherein the substrate is formed monolithically with the first layer of semiconductor material and the second layer of semiconductor material.

7. A two-terminal, monolithic, tandem photonic device as defined in claim 3, wherein the number of first layer sub-cells is not equal to the number of second layer sub-cells.

8. A two-terminal, monolithic, tandem photonic device as defined in claim 3, further comprising a third layer of semiconductor material heaving an n-type region, a p-type region, a third band-gap energy, and a plurality of third layer sub-cells formed in the third layer and electrically connected in series to form a two-terminal third layer sub-cell, wherein the number of third layer sub-cells is the same as the number of first layer sub-cells and wherein the first layer sub-cell string and the second layer sub-cell string are electrically connected in parallel to form the two-terminal, monolithic, tandem photonic device.

9. A two-terminal, monolithic, tandem photonic device as defined in claim 1 wherein the photonic device comprises a photovoltaic (PV) cell.

10. A PV cell as defined in claim 9, wherein the first band-gab energy and second band-gab energy are not equivalent in value.

11. A two-terminal, monolithic, tandem photonic device as defined in claim 1, wherein the photonic device comprises a light emitting diode (LED) cell.

12. A LED cell as defined in claim 1, wherein the first band-gab energy and the second band-gab energy are not equivalent in value.

13. A monolithic, tandem photonic device comprising:
a first layer of semiconductor material having an in-type region, a p-type region, a first band-gap energy, and a plurality of sub-cells formed therein;
a second layer of semiconductor material having an n-type region, a p-type region, a second band-gap energy, and a plurality sub-cells formed therein; and
a plurality of sub-cell strings, each of the plurality of sub-cell strings comprising two or more electrically interconnected sub-cells; wherein the plurality of sub-cell strings are electrically connected to one another in parallel.

14. A monolithic, tandem photonic device as defined in claim 13, wherein the plurality of sub-cell strings comprises at least one first layer sub-cell string including only sub-cell sub-cells formed in the first layer and at least one second layer sub-cell string including only sub-cells formed in the second layers.

15. A monolithic, tandem photonic device as defined in claim 14, wherein each of the sub-cells in the at least one first layer sub-cell string are electrically connected in series.

16. A monolithic, tandem photonic device as defined in claim 15, wherein each of the sub-cells in the at least one second layer sub-cell string are electrically connected in a combination of series and parallel connections.

17. A monolithic, tandem photonic device as defined in claim 14, wherein each of the sub-cells in the at least one second layer sub-cell string are electrically connected in series.

18. A monolithic, tandem photonic device as defined in claim 17, wherein the photonic device includes a plurality of first layer sub-cell strings and a plurality of second layer sub-cell strings, wherein each of the sub-cell strings in the plurality of first layer sub-cell strings are physically arranged along substantially linear axes that are substantially parallel with one another, and wherein each sub-cell strings in the plurality of second layer sub-cell strings are arranged along substantially linear axes that are substantially parallel with one another.

19. A monolithic, tandem photonic device as defined in claim 18, wherein the plurality of first layer sub-cell strings and the plurality of second layer sub-cell strings are substantially perpendicular to one another.

20. A monolithic, tandem photonic device as defined in claim 13, wherein the first layer sub-cell string includes a plurality of sub-cell sub-strings, each sub-cell sub-string including at least two serially connected sub-cells.

21. A monolithic, tandem photonic device as defined in claim 20, wherein each of the sub-cell sub-strings are electrically connected in parallel.

22. A monolithic, tandem photonic device as defined in claim 20, further comprising a negative bus bar and a positive bus bar, wherein each sub-cell sub-string includes a negative terminal and a positive terminal, and wherein the negative terminal of each sub-cell sub-string is connected to the negative bus bar and the positive terminal of each sub-cell sub-string is connected to the positive bus bar.

23. A monolithic, tandem photonic device as defined in claim 21, wherein the second layer sub-cell string includes a plurality of sub-cell sub-strings, each sub-cell sub-string including at least two serially connected sub-cells.

24. A monolithic, tandem photonic device as defined in claim 23, further comprising a negative bus bar and a positive bus bar, wherein each sub-cell sub-string includes a negative terminal and a positive terminal, and wherein the negative terminal of each sub-cell sub-string is connected to the negative bus bar and the positive terminal of each sub-cell sub-string is connected to the positive bus bar.

25. A two-terminal, monolithic, tandem photonic device as defined in claim 13, wherein the photonic device comprises a photovoltaic (PV) cell.

26. A PV cell as defined in claim 25, wherein the values of the first band-gab energy, second band-gab energy, and third band-gab energy are not equivalent.

27. A two-terminal, monolithic, tandem photonic device as defined in claim 13, wherein the photonic device comprises a photovoltaic (PV) cell.

28. A PV cell as defined in claim 27, wherein the first band-gab energy and second band-gab energy are not equivalent in value.

29. A two-terminal, monolithic, tandem photonic device as defined in claim 13, wherein the photonic device comprises a light emitting diode (LED) cell.

30. A LED cell as defined in claim 29, wherein the first band-gab energy and the second hand-gab energy are not equivalent in value.

31. A two-terminal, monolithic, tandem light emitting diode (LED) device comprising:
a first layer of semiconductor material having an n-type region, a p-type region, and a first band-gap energy;
a plurality of first layer LED sub-cells formed in the first layer and electrically connected to form a two-terminal first layer sub-cell string;

a second layer of semiconductor material having an n-type region, a p-type region, and a second band-gap energy; and a plurality of second layer LED sub-cells formed in the second layer and electrically connected to form a two-terminal second layer sub-cell, wherein the first layer sub-cell string and the second layer sub-cell string are separately electrically biased, and wherein the first band-gap energy and the second band gap-energy are not equivalent in value.

32. A monolithic, tandem LED device as defined in claim 31, wherein each LED sub-cell in the LED device has substantially the same outer circumferential shape.

33. A monolithic, tandem LED device as defined in claim 31, wherein each of the LED sub-cells in the first layer sub-cell string are electrically connected in series and biased at a first voltage.

34. A monolithic, tandem LED device as defined in claim 33, wherein each of the LED sub-cells in the second layer sub-cell string are electrically connected in series and biased at a second voltage.

35. A monolithic, tandem LED device as defined in claim 34, wherein the first voltage and the second voltage are not equivalent.

36. A monolithic, tandem LED device as defined in claim 35 wherein each of the LED sub-cells in the first layer LED sub-cell string are arranged along a substantially linear first layer axis.

37. A monolithic, tandem LED device as defined in claim 36, wherein each of the LED sub-cells in the second layer LED sub-cell string are arranged along a substantially linear, second layer axis.

38. A monolithic, tandem LED device as defined in claim 37, wherein the first layer axis and the second layer axis are substantially perpendicular with one another.

39. A monolithic, tandem LED device as defined in claim 37, wherein the first layer axis and the second layer axis are substantially parallel with one another.

40. A monolithic, tandem LED device as defined in claim 33, wherein each of the LED sub-cells in the second layer sub-cell string are electrically connected in a combination of series and parallel connections and biased at a second voltage.

41. A two-terminal, monolithic, tandem photonic device comprising:

a first layer of semiconductor material having an n-type region, a p-type region, and a first band-gap energy;

a plurality of first layer sub-cells formed in the first layer along a first axis and electrically connected in series to form a first layer sub-cell string;

a second layer of semiconductor material having an n-type region, a p-type region, and a second band-gap energy; and a plurality of second layer sub-cells formed in the second layer along a second axis that is not perpendicular with the first axis and electrically connected in series to form a second layer sub-cell string, wherein the first layer sub-cell string and the second layer sub-cell string are electrically connected in parallel to form the two-terminal, monolithic, tandem photonic device.

42. A two-terminal, monolithic, tandem photonic device as defined in claim 41, wherein the outer circumferential shapes of the first layer sub-cells and the second layer sub-cells are substantially the same shape.

43. A two-terminal, monolithic, tandem photonic device as defined in claim 41, wherein the second layer of semiconductor material is grown on the first layer of semiconductor material.

44. A two-terminal, monolithic, tandem photonic device as defined in claim 43, wherein the second layer of semiconductor material is grown epitaxially on the first layer of semiconductor material.

45. A two-terminal, monolithic, tandem photonic device as defined in claim 41, wherein the first layer of semiconductor material and second layer of semiconductor material are physically bonded together.

46. A method of forming a multi-layer photonic semiconductor device, the method comprising the steps of:

forming a first layer of semiconductor material having a first band-gap energy on a substrate, the first layer including a first conductivity-type region and a second conductivity-type region on a substrate;

forming a second layer of semiconductor material having a second band-gap energy on the first layer, the second layer including a first conductivity-type region and a second conductivity-type region;

forming a plurality of isolation trenches through the first and second layers;

forming a plurality of electrical interconnects at least partially within the isolation trenches between conductivity-type regions in the first layer of semiconductor material; and forming a plurality of electrical interconnects at least partially within the isolation trenches between conductivity-type regions in the second layer of semiconductor material.

47. A method of forming a multi-layer photonic semiconductor device as defined in claim 46, wherein the second layer of semiconductor materials is formed epitaxially on the first layer of semiconductor material.

48. A method of forming a multi-layer photonic semiconductor device as defined in claim 46, wherein the isolation trenches are formed substantially in parallel with one another.

49. A method of forming a photonic semiconductor device in a semiconductor structure having at least two semiconductor layers, each semiconductor layer including a first conductivity-type region and a second conductivity-type region, the method comprising the steps of:

forming a plurality of isolation trenches through the first and second semiconductor layers, the isolation trenches dividing the semiconductor structure into a plurality of sub-cell stacks, each stack including a sub-cell formed in the first semiconductor layer arid a sub-cell formed in the second semiconductor layer;

forming a plurality of first layer electrical interconnects at least partially within the isolation trenches between conductivity-type regions of sub-cells formed in the first semiconductor layer; and forming a plurality of second layer electrical interconnects at least partially within the isolation trenches between conductivity-type regions of sub-cells formed in the second semiconductor layer.

50. A method of forming a photonic semiconductor device as defined in claim 49, wherein the step of forming the first layer electrical interconnects includes forming at least one electrical interconnect between like conductivity-type regions of sub-cells formed in the second layer.

51. A method of forming a photonic semiconductor device as defined in claim 49, wherein the step of forming the plurality of isolation trenches includes forming at least two substantially linear isolation trenches that are not parallel with one another.

52. A method of forming a photonic semiconductor device as defined in claim 49, wherein the step of forming a plurality of isolation trenches includes:

forming a first isolation trench through the first and second layers along a first axis;

forming a second isolation trench through the first and second layers along a second axis, the second axis being parallel with the first axis;

forming a third isolation trench through the first and second layers along a third axis, the third axis being non-parallel with the first axis;

forming at least one electrical interconnect in the first isolation trench between conductivity-type regions in two sub-cells formed in the first layer of semiconductor material;

forming at least one interconnect in the second isolation trench between conductivity-type regions in two sub-cells formed in the first layer of semiconductor material; and forming at least one interconnect in the third isolation trench between conductivity-type regions in two sub-cells formed in the second layer of semiconductor material.

53. A method of forming a two terminal, photonic device in a semiconductor structure having at least a first semiconductor layer and a second semiconductor layer, each semiconductor layer including a first conductivity-type region and a second conductivity-type region, the method comprising the steps of:

forming a plurality of first layer sub-cells in the first semiconductor layer along a first axis;

electrically connecting the plurality of first layer sub-cells in series to form a first layer sub-cell string;

forming a plurality of second layer sub-cells in the second semiconductor layer along a second axis that is not perpendicular with the first axis;

electrically connecting the plurality of second layer sub-cells in series to form a second layer sub-cell string; and electrically connecting the first layer sub-cell string and the second layer sub-cell strings together in parallel.

54. A method of forming a two terminal, photonic device as defined in claim 53, wherein the semiconductor layers are lattice-matched.

\* \* \* \* \*